United States Patent
Kimura et al.

(10) Patent No.: US 9,641,187 B2
(45) Date of Patent: *May 2, 2017

(54) SEMICONDUCTOR DEVICE

(71) Applicant: RENESAS ELECTRONICS CORPORATION, Tokyo (JP)

(72) Inventors: Keisuke Kimura, Tokyo (JP); Yuichi Okuda, Tokyo (JP); Hideo Nakane, Tokyo (JP); Takaya Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/181,877

(22) Filed: Jun. 14, 2016

(65) Prior Publication Data

US 2016/0294403 A1 Oct. 6, 2016

Related U.S. Application Data

(60) Continuation of application No. 14/921,435, filed on Oct. 23, 2015, now Pat. No. 9,385,736, which is a
(Continued)

(30) Foreign Application Priority Data

Dec. 13, 2013 (JP) .................................. 2013-258486

(51) Int. Cl.
*H03M 1/06* (2006.01)
*H03M 1/46* (2006.01)
(Continued)

(52) U.S. Cl.
CPC ....... *H03M 1/0607* (2013.01); *H03M 1/0604* (2013.01); *H03M 1/1023* (2013.01); *H03M 1/124* (2013.01); *H03M 1/442* (2013.01); *H03M 1/462* (2013.01); *H03M 1/468* (2013.01); *H01L 23/5225* (2013.01); *H01L 27/0629* (2013.01); *H01L 2924/0002* (2013.01); *H03M 1/46* (2013.01)

(58) Field of Classification Search
CPC .... H03M 1/06; H03M 1/0604; H03M 1/0607; H03M 1/10; H03M 1/1014; H03M 1/1023

See application file for complete search history.

(56) References Cited

U.S. PATENT DOCUMENTS 5,831,562 A 11/1998 Van Auken et al.
7,151,475 B2 * 12/2006 Boemler ................. H03M 1/46
341/118

(Continued)

FOREIGN PATENT DOCUMENTS

JP 2007-259224 A 10/2007

*Primary Examiner* — Howard Williams
(74) *Attorney, Agent, or Firm* — Mattingly & Malur, PC

(57) ABSTRACT

A semiconductor device according to an aspect of the invention relates to an AD converter that converts a signal level of an analog signal into a digital value by using a comparator, and determines an amount of adjustment of an offset voltage of the comparator based on an offset determination result of the comparator obtained immediately after a least significant bit (LSB) of a digital value output as a conversion result is converted.

7 Claims, 21 Drawing Sheets

Related U.S. Application Data division of application No. 14/487,179, filed on Sep. 16, 2014, now Pat. No. 9,184,755.

(51) Int. Cl.
| | |
|---|---|
| *H03M 1/12* | (2006.01) |
| *H03M 1/44* | (2006.01) |
| *H03M 1/10* | (2006.01) |
| *H01L 23/522* | (2006.01) |
| *H01L 27/06* | (2006.01) |

(56) References Cited

U.S. PATENT DOCUMENTS

| | | |
|---|---|---|
| 7,199,745 B2 | 4/2007 | Tachibana |
| 7,352,307 B2 | 4/2008 | Iorgulescu |
| 7,764,215 B2 | 7/2010 | Wan et al. |
| 8,368,577 B2 | 2/2013 | Aruga et al. |
| 8,378,863 B2 * | 2/2013 | Ishikawa ................ H03M 1/00 341/118 |
| 8,508,398 B1 | 8/2013 | Strode |
| 8,957,805 B2 | 2/2015 | Niwa |
| 2013/0175591 A1 | 7/2013 | Bairo |
| 2015/0002321 A1 | 1/2015 | Zhou et al. |

* cited by examiner

SEMICONDUCTOR DEVICE

CROSS-REFERENCE TO RELATED APPLICATIONS

This application is a continuation application of U.S. Ser. No. 14/921,435, filed Oct. 23, 2015 which is a divisional application of U.S. patent application Ser. No. 14/487,179, filed Sep. 16, 2014, now U.S. Pat. No. 9,184,755, issued Nov. 10, 2015 which is based upon and claims the benefit of priority from Japanese patent application No. 2013-258486, filed on Dec. 13, 2013, the disclosure of which is incorporated herein in its entirety by reference.

BACKGROUND

The present invention relates to a semiconductor device, and more particularly, to a semiconductor device including, for example, an analog-to-digital conversion circuit including a comparator.

Successive approximation AD (Analog-to-Digital) converters include two types, i.e., a synchronous operation type and an asynchronous operation type. Synchronous operation type successive approximation AD converters, which perform a successive approximation operation in synchronization with an external clock signal, require a high-frequency external clock signal to operate at a high speed. On the other hand, asynchronous operation type successive approximation AD converters internally generate a clock signal based on an externally-input clock signal, thereby making it possible to operate at a higher speed than in the case of using the external clock signal. For this reason, the asynchronous operation type successive approximation AD converters are used for high-accuracy and high-speed AD conversion. The asynchronous operation type successive approximation AD converters can be applied to, for example, wireless communication devices and industrial equipment.

In a successive approximation AD converter called a charge-sharing type successive approximation AD converter, the accuracy of the AD conversion deteriorates due to an offset of a comparator. Accordingly, it is necessary to perform not only the successive approximation operation, but also an offset correction operation to correct the comparator offset to zero. However, it is difficult for applications requiring constant operation, such as wireless communications (WCDMA®, FD-LTE, etc.) and rotary encoders intended for industrial equipment, to perform the correction operation for correcting the comparator offset. It is also possible to employ a method for correcting the comparator offset only once before use (for example, foreground operation). However, the comparator offset varies when there is a change in the environment during use, which leads to deterioration in the accuracy of AD conversion.

In this regard, Japanese Unexamined Patent Application Publication No. 2007-259224 discloses a technique for correcting an offset of a comparator to zero by a background operation. In an AD converter disclosed in Japanese Unexamined Patent Application Publication No. 2007-259224, a comparator input is short-circuited during sampling and a comparator output is held in a capacitor, to thereby correct the offset of the comparator.

SUMMARY

However, the AD converter disclosed in Japanese Unexamined Patent Application Publication No. 2007-259224 is a static operation type AD converter that holds the output value of the comparator in the capacitor. Therefore, the correction method cannot be applied to a dynamic operation type AD converter that performs a conversion operation in synchronization with a clock signal. In other words, the related art has a problem that the type of AD converters capable of correcting an offset is limited.

The other problems to be solved and novel features of the invention will become apparent from the following description and the attached drawings.

A semiconductor device according to a first aspect of the present invention relates to an AD converter that converts a signal level of an analog signal into a digital value by using a comparator, and determines an amount of adjustment of an offset voltage of the comparator based on an offset determination result of the comparator obtained immediately after a least significant bit (LSB) of a digital value output as a conversion result is converted.

According to the aspect of the invention, the semiconductor device can reduce the amount of offset of various types of AD converters.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
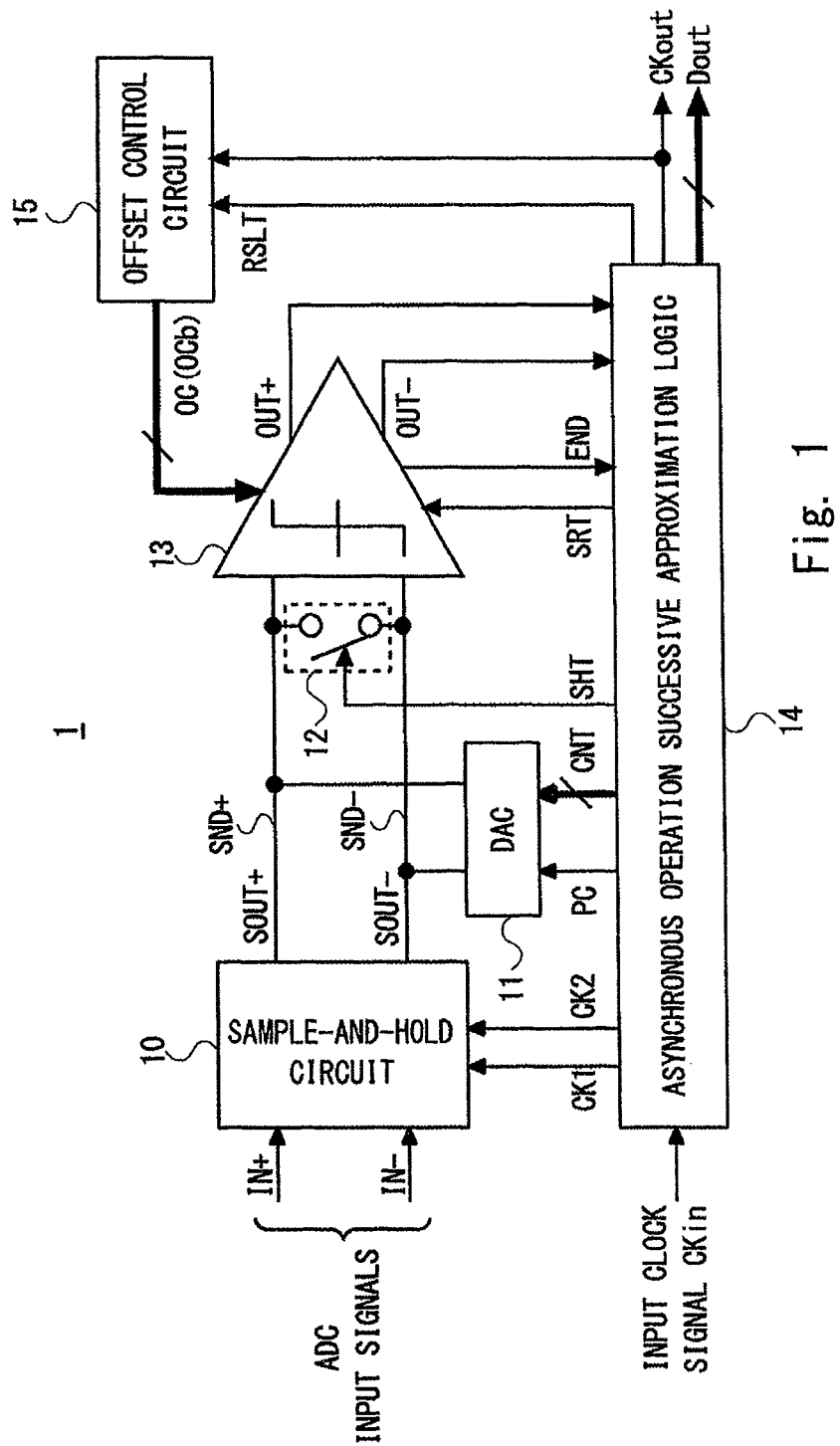
FIG. 1 is a block diagram showing an AD converter according to a first embodiment.

The following description and the drawings are omitted and simplified as appropriate to clarify the explanation. The elements illustrated in the drawings as functional blocks for performing various processes can be implemented hardwarewise by a CPU, a memory, and other circuits, and can be implemented softwarewise by a program loaded into a memory. Accordingly, it is understood by those skilled in the art that the functional blocks can be achieved in various forms including hardware alone, software alone, and combinations thereof, and are not limited to any of them. Note that like elements are designated by identical reference numerals throughout the drawings, and the description thereof is omitted as necessary.

The above-mentioned program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line, such as electric wires and optical fibers, or a wireless communication line.

First Embodiment

FIG. 1 is a block diagram showing an AD (Analog-to-Digital) converter 1 according to a first embodiment. The AD converter 1 shown in FIG. 1 is a semiconductor device having a configuration in which elements constituting the circuit are formed on a semiconductor substrate. The semiconductor device may include circuits other than the AD converter 1 shown in FIG. 1.

The first embodiment illustrates, as an example of the AD converter, an asynchronous-type AD converter that outputs a single conversion result output value (for example, an AD conversion result signal) which is represented by a digital value converted from an analog value based on an externally-input input clock signal and performs a conversion operation based on an internal clock signal which is generated in the AD converter. The following embodiments can also be applied to a synchronous-type AD converter that is externally supplied with a clock signal for use in the conversion operation.

As shown in FIG. 1, the AD converter 1 according to the first embodiment includes a sample-and-hold circuit 10, a digital-to-analog conversion circuit (for example, a DAC 11), a switch circuit (for example, an input short-circuiting switch 12), a comparator 13, and a successive approximation control circuit (for example, an asynchronous operation successive approximation logic 14).

The sample-and-hold circuit 10 samples voltage levels of input voltages (for example, a voltage of a positive-side input signal IN+ and a voltage of a negative-side input signal IN−) according to sampling clock signals (for example, non-overlapping clock signals CK1 and CK2). The sample-and-hold circuit 10 outputs one of differential voltages corresponding to the sampled voltage levels to a first comparison line (for example, a positive-side comparison line SND+), and outputs the other of the differential voltages to a second comparison line (for example, a negative-side comparison line SND−).

The comparator 13 outputs output values (for example, determination result signals OUT+ and OUT−) indicating a high level or a low level according to a voltage difference between the first comparison line and the second comparison line. In the first embodiment, the comparator 13 performs an operation for comparing the input differential voltages corresponding to a determination start signal SRT which is generated by the asynchronous operation successive approximation logic 14 based on an input clock signal CKin. Upon completion of the comparison operation, the comparator 13 notifies the asynchronous operation successive approximation logic 14 of a determination end signal END.

The comparator 13 receives an offset control value OC. The comparator 13 has a function for adjusting an input offset voltage according to the offset control value OC.

The input short-circuiting switch 12 is provided between the first comparison line and the second comparison line. A conductive state and a cut-off state of the input short-circuiting switch 12 are switched by a switch control signal (for example, an input short-circuiting signal SHT) output from the asynchronous operation successive approximation logic 14.

The DAC 11 changes the voltages of the first comparison line SND+ and the second comparison line SND− according to the output values (for example, the determination result signals OUT+ and OUT−). More specifically, the DAC 11 according to the first embodiment changes the voltages of the first comparison line SND+ and the second comparison line SND− according to a pre-charge signal PC and a DAC control signal CNT which are generated by the asynchronous operation successive approximation logic 14 based on the determination result signals OUT+ and OUT−.

The asynchronous operation successive approximation logic 14 controls the sample-and-hold circuit 11, the comparator 13, and the DAC 11 according to a preset successive approximation sequence, and outputs a number of AD conversion result signals Dout corresponding to the number of bits of the conversion result output value Dout. Further, upon acquisition of the output value (for example, the determination result signal) of all bits of the AD conversion result signals Dout, the asynchronous operation successive approximation logic 14 brings the input short-circuiting switch 12 into the conductive state, and outputs an offset determination signal (for example, a DCOC comparison determination result signal RSLT) for adjusting the input offset voltage of the comparator according to the determination result signal during a period in which the input short-circuiting switch 12 is in the conductive state.

The asynchronous operation successive approximation logic 14 generates the non-overlapping clock signals CK1 and CK2 and an output clock signal CKout based on the input clock signal CKin. Further, the asynchronous operation successive approximation logic 14 generates the determination start signal SRT indicating a comparison operation timing for the comparator 13 based on the input clock signal CKin.

An offset control circuit 15 increases or decreases the offset control value OC according to the logic level of the DCOC comparison determination result signal RSLT output from the asynchronous operation successive approximation logic 14. This offset control value is a value indicated by a control signal of a plurality of bits. The offset control value includes the offset control value OC for adjusting the amount of offset in a positive direction, and an offset control value OCb for adjusting the amount of offset in a negative direction. In the following description, unless it is necessary to distinguish the offset control value OC from the offset control value OCb, the offset control value including the offset control value OC and the offset control value OCb is denoted by OC.

When the logic level of the DCOC comparison determination result signal RSLT is a first logic level (for example, a high level), the offset control circuit 15 increases the offset control value OC. When the logic level of the DCOC comparison determination result signal RSLT is a second logic level (for example, a low level), the offset control circuit 15 decreases the offset control value OC. In the first embodiment, the offset control circuit 15 updates the offset control value OC in each conversion cycle in which the AD converter 1 generates all bit values of the AD conversion result signals Dout. In other words, in the first embodiment, the offset control circuit 15 updates the offset control value OC every time the AD converter 1 outputs a single AD conversion result signal Dout.

Figure 2:
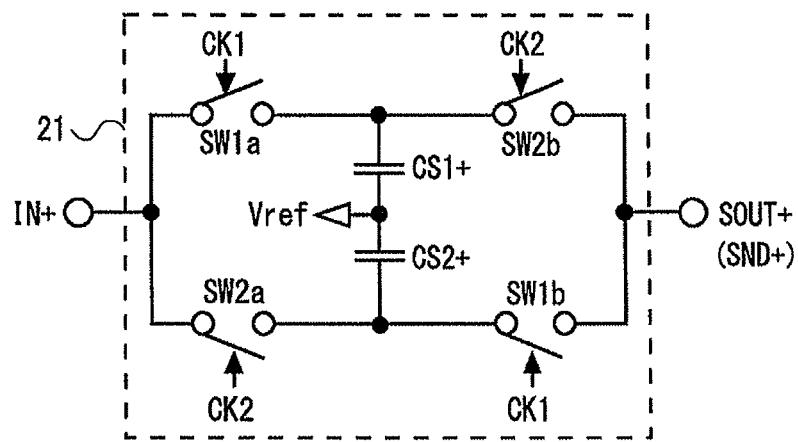
FIG. 2 is a circuit diagram showing a sample-and-hold circuit according to the first embodiment.
Figure 2:
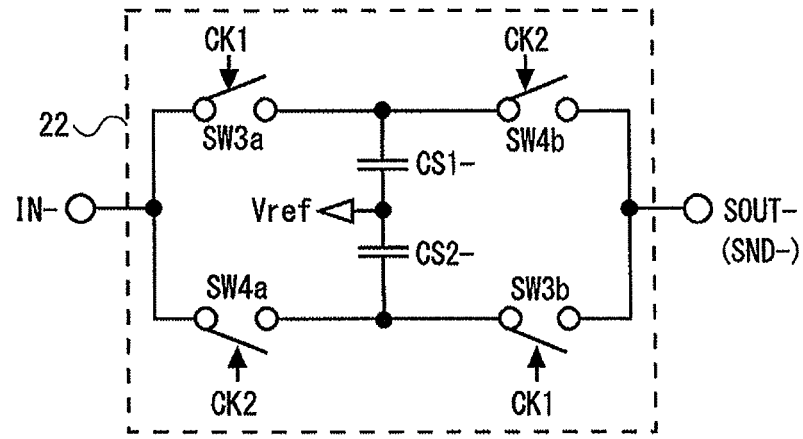

Next, the sample-and-hold circuit 10, the DAC 11, and the comparator 13 will be described in more detail. FIG. 2 is a circuit diagram showing the sample-and-hold circuit 10 according to the first embodiment.

As shown in FIG. 2, the sample-and-hold circuit 10 includes a positive-side sample-and-hold circuit 21 and a negative-side sample-and-hold circuit 22. The positive-side sample-and-hold circuit 21 samples the positive-side input signal IN+ among ADC input signals, and outputs the sampled value to the positive-side comparison line SND+ as a positive-side comparison voltage SOUT+. The negative-side sample-and-hold circuit 22 samples the negative-side input signal IN− among the ADC input signals, and outputs the sampled value to the negative-side comparison line SND− as a negative-side comparison voltage SOUT−.

The positive-side sample-and-hold circuit 21 includes switches SW1a, SW1b, SW2a, and SW2b, and sampling capacitors CS1+ and CS2+. The switch SW1a is connected to a node between a first input terminal, which receives the positive-side input signal IN+, and one end of the sampling capacitor CS1+. The switch SW2a is connected to a node between the first input terminal and one end of the sampling capacitor CS2+. The switch SW2b is connected to a node between one end of the sampling capacitor CS1+ and a first output terminal connected to the positive-side comparison line SND+. The switch SW1b is connected to a node between one end of the sampling capacitor CS2+ and the first output terminal. The other end of the sampling capacitor CS1+ and the other end of the sampling capacitor CS2+ are connected to each other, and a node therebetween is supplied with a reference voltage Vref.

The negative-side sample-and-hold circuit 22 includes switches SW3a, SW3b, SW4a, and SW4b, and sampling capacitors CS1− and CS2−. The switch SW3a is connected to a node between a second input terminal, which receives the negative-side input signal IN−, and one end of the sampling capacitor CS1−. The switch SW4a is connected to a node between the second input terminal and one end of the sampling capacitor CS2−. The switch SW4b is connected to a node between one end of the sampling capacitor CS1− and a second output terminal connected to the negative-side comparison line SND−. The switch SW3b is connected to a node between one end of the sampling capacitor CS2− and the second output terminal. The other end of the sampling capacitor CS1− and the other end of the sampling capacitor CS2− are connected to each other, and a node therebetween is supplied with the reference voltage Vref.

Figure 3:
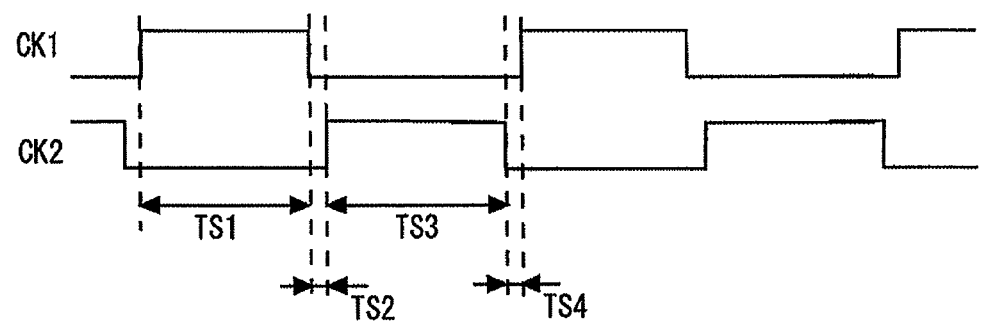
FIG. 3 is a timing diagram for explaining non-overlapping clock signals used for the AD converter according to the first embodiment.

Switching conditions of the switches SW1a, SW1b, SW3a, and SW3b are controlled by the non-overlapping clock signal CK1, and switching conditions of the switches SW2a, SW2b, SW4a, and SW4b are controlled by the non-overlapping clock signal CK2. The non-overlapping clock signals CK1 and CK2 will be described in detail. FIG. 3 shows a timing diagram for explaining the non-overlapping clock signals used for the AD converter 1 according to the first embodiment.

As shown in FIG. 3, the non-overlapping clock signals CK1 and CK2 are differential clock signals having mutually inverted logic levels. A rising edge of the non-overlapping clock signal CK1 occurs after a falling edge of the non-overlapping clock signal CK2. On the other hand, a falling edge of the non-overlapping clock signal CK1 occurs before a rising edge of the non-overlapping clock signal CK2. In other words, when the non-overlapping clock signals CK1 and CK2 are used, a period in which two clock signals supplied to the sample-and-hold circuit 10 change to the low level is generated. In the example shown in FIG. 3, the two clock signals change to the low level in periods TS2 and TS4.

Figure 4:
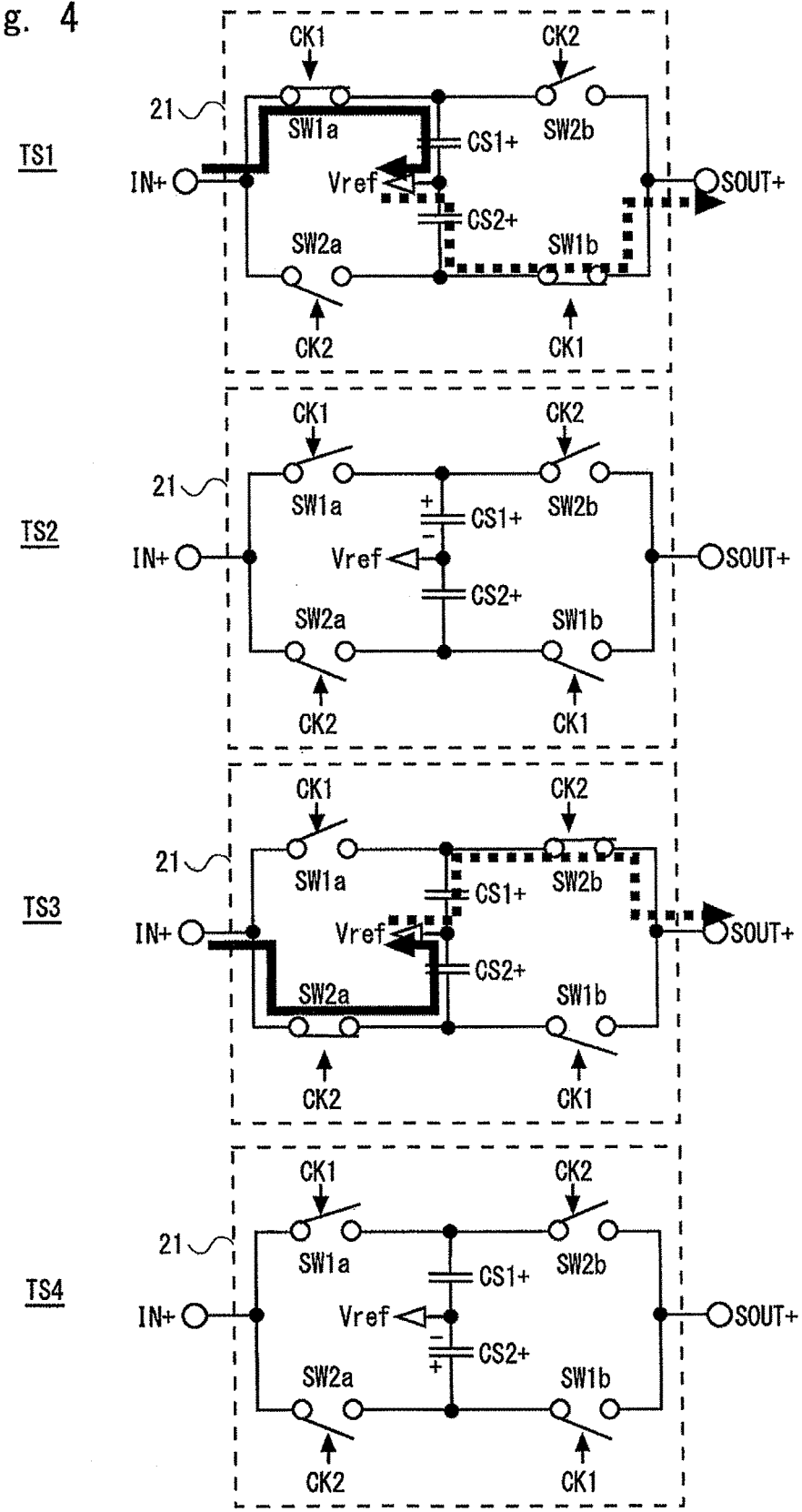
FIG. 4 is a diagram for explaining an operation of the sample-and-hold circuit according to the first embodiment.

Next, the operation of the sample-and-hold circuit 10 will be described. FIG. 4 shows a diagram for explaining the operation of the sample-and-hold circuit 10 according to the first embodiment. As shown in FIG. 4, the sample-and-hold circuit 10 repeatedly performs four operations. The four operations are carried out in periods TS1 to TS4, respectively, in the timing diagram shown in FIG. 3. FIG. 4 shows the states of the circuits in each period. Note that in the sample-and-hold circuit 10, the positive-side sample-and-hold circuit 21 and the negative-side sample-and-hold circuit 22 operate in the same manner. Accordingly, the operation of only the positive-side sample-and-hold circuit 21 will now be described.

First, in the period TS1, the non-overlapping clock signal CK1 changes to the high level (for example, a power supply voltage level), and the non-overlapping clock signal CK2 changes the low level (for example, a ground voltage level). Accordingly, in the sample-and-hold circuit 10, the switches SW1a and SW1b are in the conductive state and the switches SW2a and SW2b are in the cut-off state. As a result, electric charge corresponding to the voltage level of the positive-side input signal IN+ is accumulated in the sampling capacitor CS1+, and a voltage corresponding to the amount of electric charge accumulated in the sampling capacitor CS2+ is output as the positive-side comparison voltage SOUT+.

In the period TS2, the non-overlapping clock signals CK1 and CK2 change to the low level. Accordingly, in the sample-and-hold circuit 10, all the switches SW1a, SW1b, SW2a, and SW2b are in the cut-off state. This allows the electric charge of each of the sampling capacitors CS1+ and CS2+ to be held.

In the period TS3, the non-overlapping clock signal CK1 changes to the low level and the non-overlapping clock signal CK2 changes to the high level. Accordingly, in the sample-and-hold circuit 10, the switches SW1a and SW1b are in the cut-off state and the switches SW2a and SW2b are in the conductive state. As a result, electric charge corresponding to the voltage level of the positive-side input signal IN+ is accumulated in the sampling capacitor CS2+, and a voltage corresponding to the amount of electric charge accumulated in the sampling capacitor CS1+ is output as the positive-side comparison voltage SOUT+.

In the period TS4, both the non-overlapping clock signals CK1 and CK2 change to the low level. Accordingly, in the sample-and-hold circuit 10, all the switches SW1a, SW1b, SW2a, and SW2b are in the cut-off state. This allows the electric charge of each of the sampling capacitors CS1+ and CS2+ to be held.

As seen from the above description, in the sample-and-hold circuit 10, a sampling value to be subsequently output to the other sampling capacitor is sampled during a period in which the accumulated sampling value is output to one sampling capacitor. This configuration allows the sample-and-hold circuit 10 to reduce the time for switching the sampling period and reduce the conversion cycle of the AD converter 1, thereby allowing the AD converter 1 to operate at a higher speed.

Figure 5:
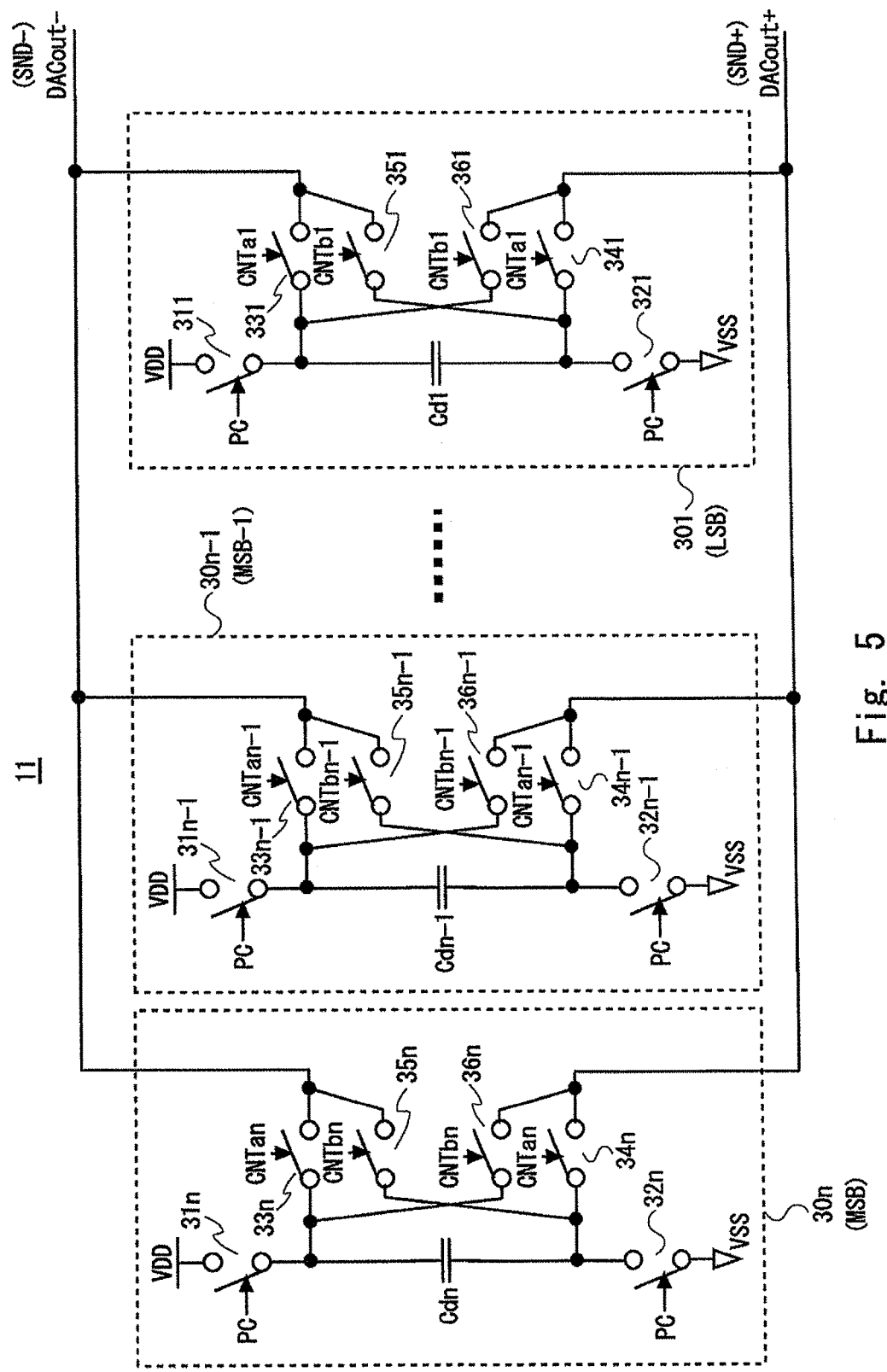
FIG. 5 is a circuit diagram showing a DAC according to the first embodiment.

Next, the DAC 11 according to the first embodiment will be described in detail. FIG. 5 is a circuit diagram showing the DAC 11 according to the first embodiment. As shown in FIG. 5, the DAC 11 according to the first embodiment has a configuration in which a number of unit digital-to-analog conversion circuits corresponding to the number of bits of the AD conversion result signal Dout are connected in parallel between DAC output lines DACout+ and DACout−. In the example shown in FIG. 5, the DAC 11 includes unit digital-to-analog conversion circuits 301 to 30n. In this case, the unit digital-to-analog converter 301 corresponds to the least significant bit (LSB) of the AD conversion result signal Dout, and the unit digital-to-analog converter 30n corresponds to the most significant bit (MSB) of the AD conversion result signal Dout.

The unit digital-to-analog converters 301 to 30n have the same configuration. Accordingly, only the unit digital-to-analog converter 30n will now be described. Note that in FIG. 5, n, n−1, . . . , and 1 (n represents the number of bits of the AD conversion result signal Dout) are added to the end of the reference numerals of the respective components, to thereby represent the components corresponding to the respective bits.

As shown in FIG. 5, the unit digital-to-analog converter 30n includes switches 31n, 32n, 33n, 34n, 35n, and 36n, and a pre-charge capacitor Cdn. One end of the switch 31n is connected to a power supply line supplied with a power supply voltage VDD, and the other end of the switch 31n is connected to one end of the pre-charge capacitor Cdn. The other end of the pre-charge capacitor Cdn is connected to one end of the switch 32n. The other end of the switch 32n is connected to a ground line supplied with a ground voltage VSS.

The switch 33n is connected to a node between the DAC output line DACout− and a line that connects the switch 31n and the pre-charge capacitor Cdn to each other. The switch 34n is connected to a node between the DAC output line DACout+ and a line that connects the switch 32n and the pre-charge capacitor Cdn to each other. The switch 35n is connected to a node between the DAC output line DACout− and the line that connects the switch 32n and the pre-charge capacitor Cdn to each other. The switch 36n is connected to a node between the DAC output line DACout+ and the line that connects the switch 31n and the pre-charge capacitor Cdn to each other. The DAC output line DACout+ is connected to the positive-side comparison line SND+, and the DAC output line DACout− is connected to the negative-side comparison line SND−.

Switching conditions of the switches 31n and 32n are controlled by the pre-charge signal PC output from the asynchronous operation successive approximation logic 14. Switching conditions of the switches 33n to 36n are controlled by the DAC control signal CNT output from the asynchronous operation successive approximation logic 14. The DAC control signal CNT includes a DAC control signal CNTa and a DAC control signal CNTb. The DAC control signal CNTa is set to an enabled state (for example, a high level) when the determination result obtained based on the determination result signals OUT+ and OUT− is positive. The DAC control signal CNTb is set to the enabled state when the determination result is negative. The DAC control signals CNTa and CNTb are separately supplied to each unit digital-to-analog converter. Thus, in order to distinguish the unit digital-to-analog converters to which the DAC control signals are supplied, reference symbols (for example, n, n−1, . . . , and 1) denoting the respective bits of the unit digital-to-analog converters to which the DAC control signals are supplied are added to the end of "CNTa" and "CNTb" in FIG. 5. In the example shown in FIG. 5, the switches 33n and 34n are each supplied with a DAC control signal CNTan, and the switches 35n and 36n are each supplied with a DAC control signal CNTbn.

Figure 6:
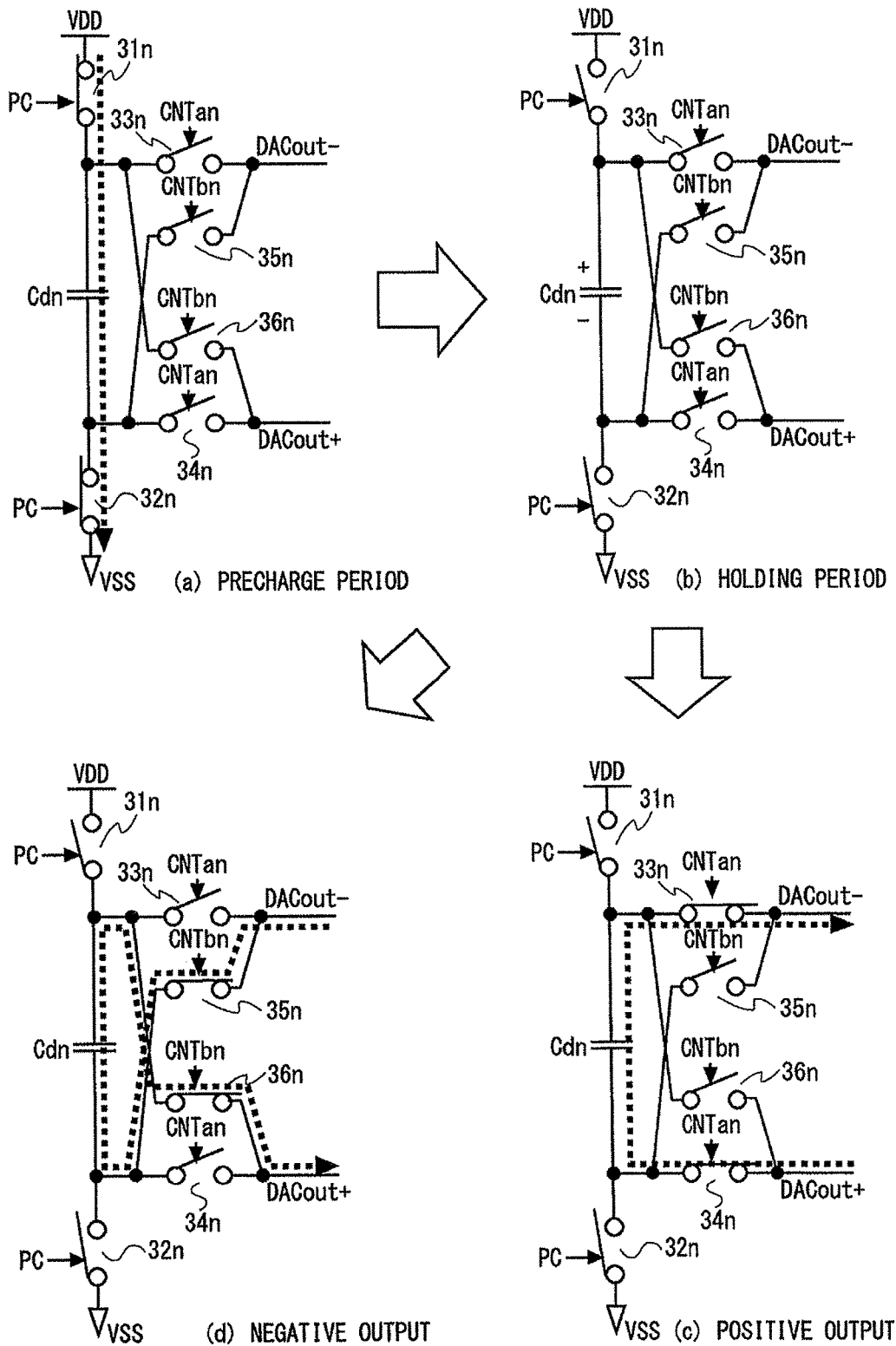
FIG. 6 is a diagram for explaining an operation of the DAC according to the first embodiment.

Next, the operation of the DAC 11 according to the first embodiment will be described. FIG. 6 shows a diagram for explaining the operation of the DAC according to the first embodiment. As shown in FIG. 6, the operation of the DAC 11 can be divided into three periods, i.e., a pre-charge period, a holding period, and an output period. The output period of the DAC 11 can be divided into a positive output and a negative output.

During the pre-charge period, the switches 31n and 32n are in the conductive state and the switches 33n to 36n are in the cut-off state. This allows the DAC 11 to accumulate electric charge in the pre-charge capacitor Cdn. Next, during the holding period, the DAC 11 brings the switches 31n to 36n into the cut-off state and holds the electric charge accumulated in the pre-charge capacitor Cdn.

The DAC 11 provides a positive output or a negative output according to the result of the determination made in the asynchronous operation successive approximation logic 14. In the positive output, the DAC 11 brings the switches 31n, 32n, 35n, and 36n into the cut-off state and brings the switches 33n and 34n into the conductive state. This allows the DAC 11 to decrease the voltage difference between the positive-side comparison line SND+ and the negative-side comparison line SND−. On the other hand, in the negative output, the DAC 11 brings the switches 31n, 32n, 33n, and 34n into the cut-off state and brings the switches 35n and 36n into the conductive state. This allows the DAC 11 to increase the voltage difference between the positive-side comparison line SND+ and the negative-side comparison line SND−.

Figure 7:
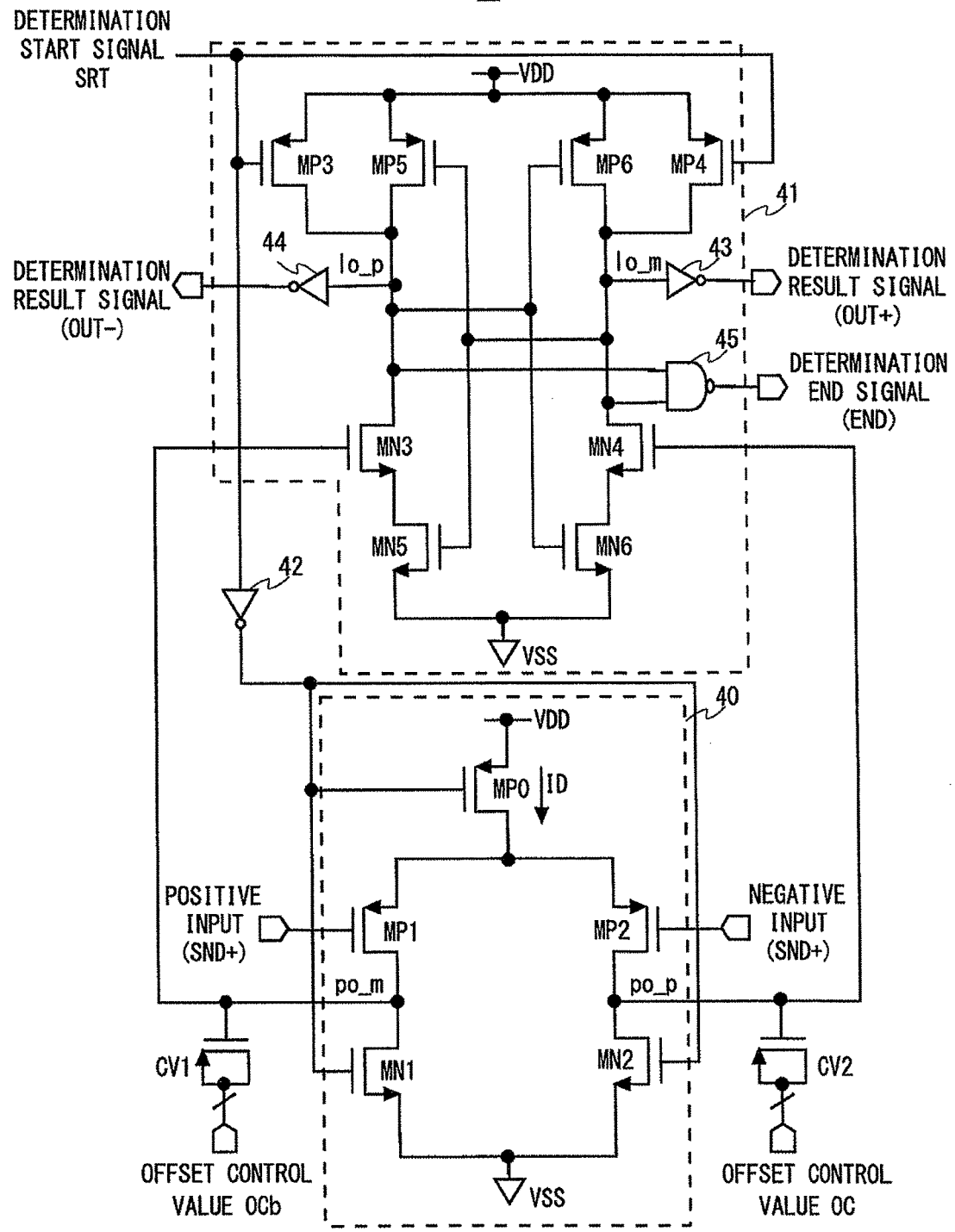
FIG. 7 is a circuit diagram showing a comparator according to the first embodiment.

Next, the comparator 13 according to the first embodiment will be described in detail. FIG. 7 is a circuit diagram showing the comparator 13 according to the first embodiment. As shown in FIG. 7, the comparator 13 according to the first embodiment includes a pre-amplifier 40, a latch circuit 41, offset adjustment capacitors CV1 and CV2, and an inverter 42.

The pre-amplifier 40 amplifies the voltage difference between the first comparison line (for example, the positive-side comparison line SND+) and the second comparison line (for example, the negative-side comparison line SND−), and outputs a first intermediate output voltage po_m and a second intermediate output voltage po_p. The first intermediate output voltage po_m is supplied to the latch circuit 41 through a first intermediate voltage line. The second intermediate output voltage po_p is supplied to the latch circuit 41 through a second intermediate voltage line.

The offset adjustment capacitor CV1 is connected to the first intermediate voltage line through which the first intermediate output voltage po_m is transmitted. The offset adjustment capacitor CV2 is connected to the second intermediate voltage line through which the second intermediate output voltage po_p is transmitted. The offset adjustment capacitor CV1 is supplied with the offset control value OCb, and the offset adjustment capacitor CV2 is supplied with the offset control value OC. The comparator 13 changes the capacitance ratio between the offset adjustment capacitor CV1 and the offset adjustment capacitor CV2 according to the offset control values OC and OCb, thereby adjusting the input offset voltage. Note that the offset adjustment capacitors CV1 and CV2 are capacitors which are formed using transistors. The offset adjustment capacitors CV1 and CV2 each have a configuration in which a plurality of transistors are connected in parallel, and the capacitance values of the capacitors are changed by switching between a high-level signal and a low-level signal to be supplied to the source or drain of each transistor according to the offset control values OC and OCb.

The latch circuit 41 determines the logic level of the output values (for example, the determination result signals OUT+ and OUT−) according to the voltage difference between the first intermediate output voltage po_m and the second intermediate output voltage po_p.

The circuit configurations of the pre-amplifier 40 and the latch circuit 41 will now be described in more detail. The pre-amplifier 40 includes PMOS transistors MP0, MP1, and MP2, and NMOS transistors MN1 and MN2.

The gate of the PMOS transistor MP0 is supplied with the determination start signal SRT, and the source of the PMOS transistor MP0 is connected to the power supply line supplied with the power supply voltage VDD. The drain of the PMOS transistor MP0 is connected to the sources of the PMOS transistors MP1 and MP2. The PMOS transistor MP0 supplies an operating current ID to a differential pair composed of the PMOS transistors MP1 and MP2 during a period in which the determination start signal SRT supplied through the inverter 42 is at the low level (at this time, the determination start signal SRT is at the high level).

The PMOS transistor MP1 and the NMOS transistor MN1 are connected in series between the drain of the PMOS transistor MP0 and the ground line supplied with the ground voltage VSS. The first intermediate output voltage po_m is output from a node between the PMOS transistor MP1 and the NMOS transistor MN1. The gate of the PMOS transistor MP1 is connected to the positive-side comparison line SND+ and is supplied with a positive input signal (for example, the positive-side comparison voltage SOUT+). The gate of the NMOS transistor MN1 is supplied with the determination start signal SRT through the inverter 42. The NMOS transistor MN1 is in the cut-off state during a period in which the determination start signal SRT supplied through the inverter 42 is at the low level (at this time, the determination start signal SRT is at the high level). The NMOS transistor MN1 is in the conductive state during a period in which the determination start signal SRT supplied through the inverter 42 is at the high level (at this time, the determination start signal SRT is at the low level).

The PMOS transistor MP2 and the NMOS transistor MN2 are connected in series between the drain of the PMOS transistor MP0 and the ground line supplied with the ground voltage VSS. The second intermediate output voltage po_p is output from a node between the PMOS transistor MP2 and the NMOS transistor MN2. The gate of the PMOS transistor MP2 is connected to the negative-side comparison line SND− and is supplied with a negative input signal (for example, the negative-side comparison voltage SOUT−). The gate of the NMOS transistor MN2 is supplied with the determination start signal SRT through the inverter 42. The NMOS transistor MN2 is in the cut-off state during a period in which the determination start signal SRT supplied through the inverter 42 is at the low level (at this time, the determination start signal SRT is at the high level). The NMOS transistor MN2 is in the conductive state during a period in which the determination start signal SRT supplied through the inverter 42 is at the high level (at this time, the determination start signal SRT is at the low level).

The latch circuit 41 includes PMOS transistors MP3 to MP6, NMOS transistors MN3 to MN6, inverters 43 and 44, and a NAND circuit 45.

The sources of the PMOS transistors MP3 to MP6 are each connected to the power supply line. The gates of the PMOS transistors MP3 and MP4 are each supplied with the determination start signal SRT. The PMOS transistor MP3 is connected in parallel to the PMOS transistor MP5, and the PMOS transistor MP4 is connected in parallel to the PMOS transistor MP6.

The PMOS transistor MP5 and the NMOS transistors NM3 and NM5 are connected in series between the power supply line and the ground line. The NMOS transistor NM3 is provided between the PMOS transistor MP5 and the NMOS transistor MN5. The gate of the PMOS transistor MP5 and the gate of the NMOS transistor NM5 are connected to each other and are also connected to a line that connects the PMOS transistor MP6 and the NMOS transistor MN4 to each other. The gate of the NMOS transistor MN3 receives the first intermediate output voltage po_m.

The PMOS transistor MP6 and the NMOS transistors NM4 and NM6 are connected in series between the power supply line and the ground line. The NMOS transistor NM4 is provided between the PMOS transistor MP6 and the NMOS transistor MN6. The gate of the PMOS transistor MP6 and the gate of the NMOS transistor NM6 are connected to each other and are also connected to a line that connects the PMOS transistor MP5 and the NMOS transistor MN3 to each other. The gate of the NMOS transistor MN4 receives the second intermediate output voltage po_p.

In the latch circuit 41, a second output signal lo_p is output from the line that connects the PMOS transistor MP5 and the NMOS transistor MN3 to each other. The comparator 13 brings the determination result signal OUT− into the low level when the voltage level of the second output signal lo_p is higher than a threshold voltage of the inverter 44. The comparator 13 brings the determination result signal OUT− into the high level when the voltage level of the second output signal lo_p is lower than the threshold voltage of the inverter 44.

Further, in the latch circuit 41, a first output signal lo_m is output from the line that connects the PMOS transistor MP6 and the NMOS transistor MN4 to each other. The comparator 13 brings the determination result signal OUT+ into the low level when the voltage level of the first output signal lo_m is higher than a threshold voltage of the inverter 43. The comparator 13 brings the determination result signal OUT+ into the high level when the voltage level of the first output signal lo_m is lower than the threshold voltage of the inverter 43.

Furthermore, in the latch circuit 41, when the voltage difference between the first output signal lo_m and the second output signal lo_p reaches a sufficient level, the NAND circuit 45 switches the logic level of the determination end signal END.

Figure 8:
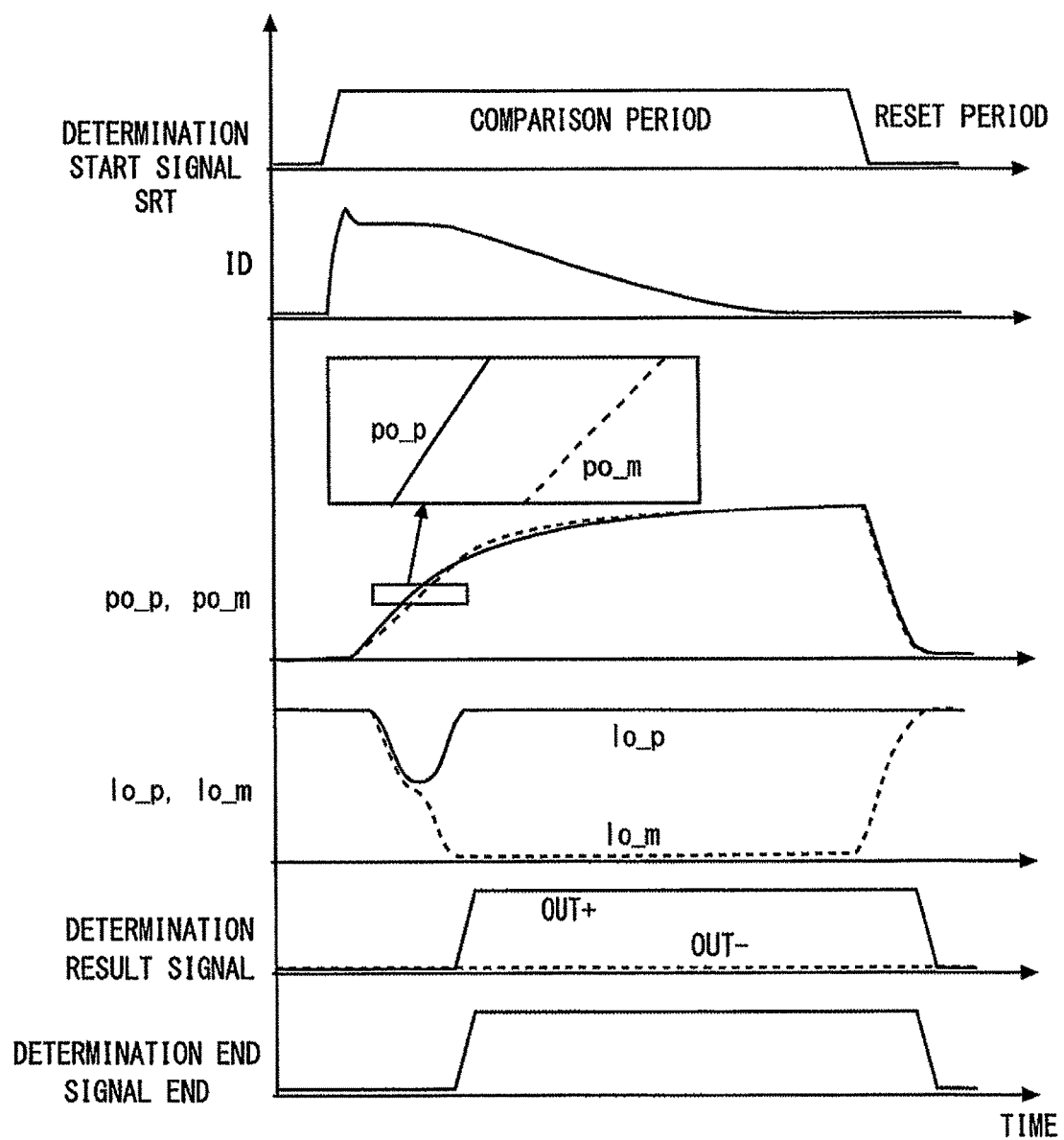
FIG. 8 is a timing diagram for explaining an operation of the comparator according to the first embodiment.
Figure 9:
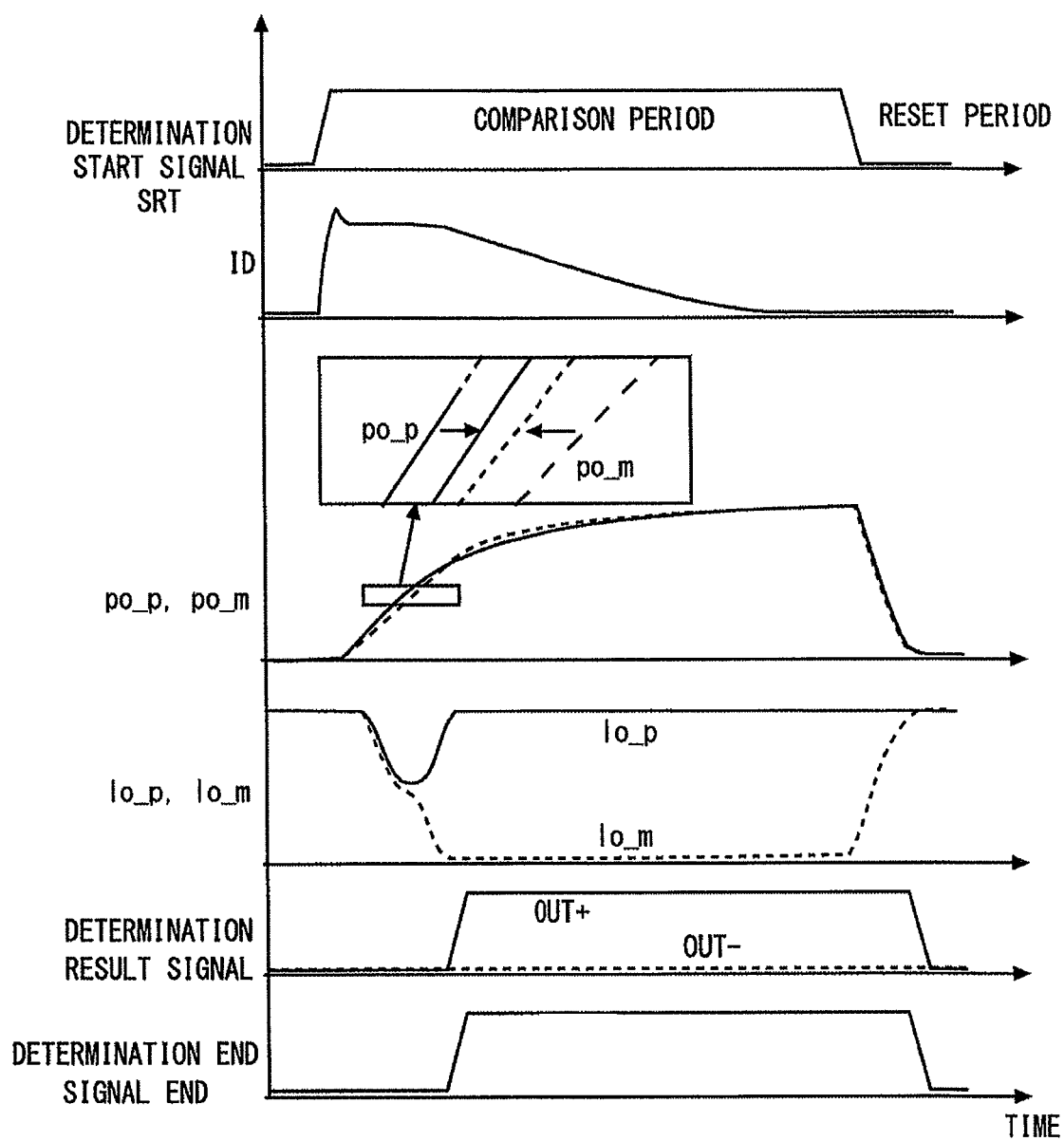
FIG. 9 is a timing diagram for explaining an operation of the comparator according to the first embodiment.
Figure 10:
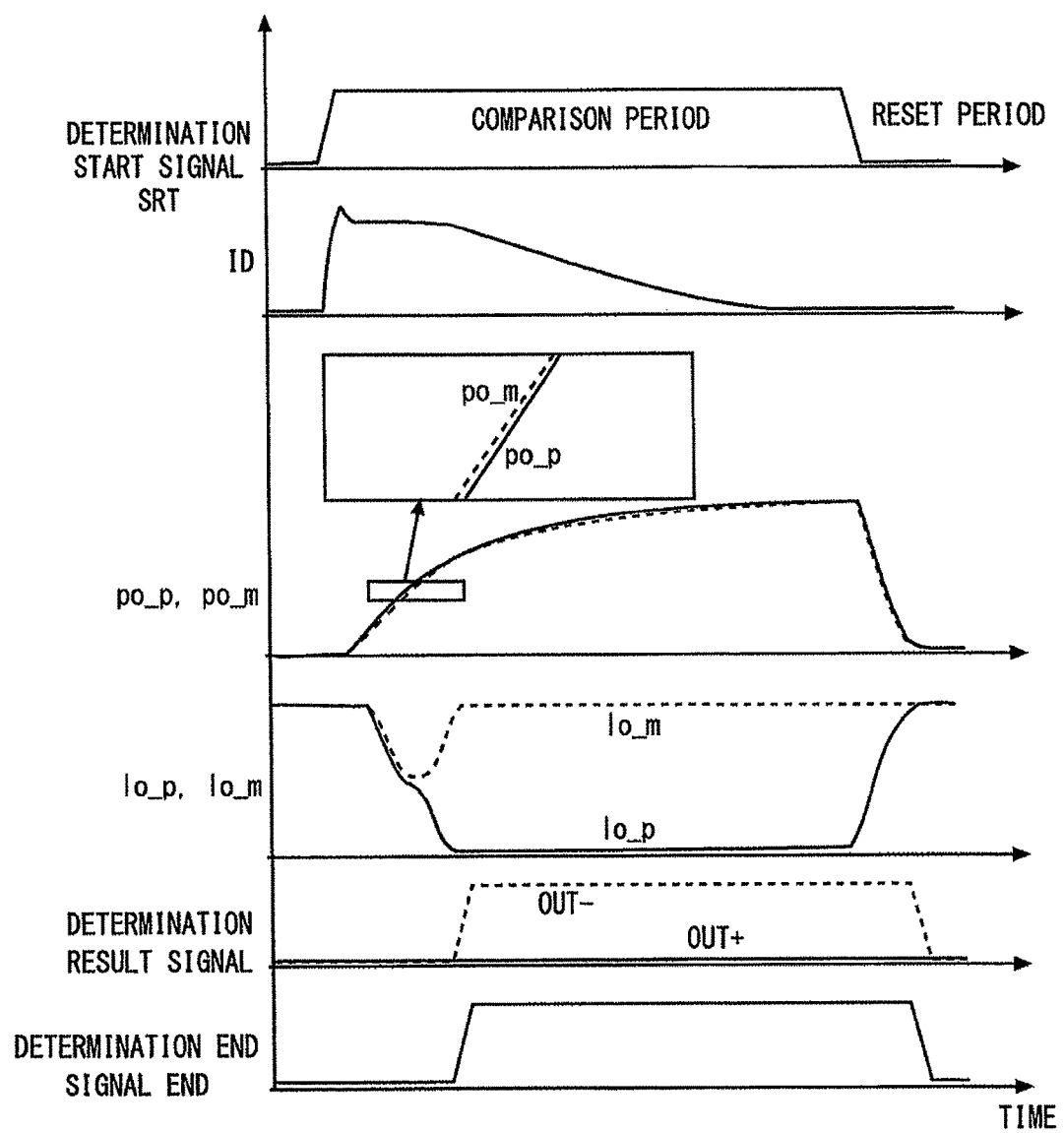
FIG. 10 is a timing diagram for explaining an operation of the comparator according to the first embodiment.

Next, the operation of the comparator 13 according to the first embodiment will be described. In particular, an offset adjustment operation and an offset determination process in which the input short-circuiting switch 12 causes the positive-side comparison line SND+ and the negative-side comparison line SND− to be short-circuited will be described. FIGS. 8 to 10 show timing diagrams for explaining the operation of the comparator 13 according to the first embodiment. FIG. 8 shows a case where the offset control value OC is "0". FIG. 9 shows a case where the offset control value OC is "+1". FIG. 10 shows a case where the offset control value OC is "+2". The timing diagrams of FIGS. 8 to 10 each show the state in which the input short-circuiting switch 12 causes the positive-side comparison line SND+ and the negative-side comparison line SND− to be short-circuited, and the voltage difference between the signals input to the comparator 13 is zero. In the timing diagrams of FIGS. 8 to 10, a change in the first intermediate output voltage po_m and a change in the second intermediate output voltage po_p during a period in which the latch circuit 41 determines the magnitude relationship between the first intermediate output voltage po_m and the second intermediate output voltage po_p are shown as an enlarged view.

As shown in FIGS. 8 to 10, the comparator 13 causes the first intermediate output voltage po_m and the second intermediate output voltage po_p to rise when the determination start signal SRT changes to the high level. At this time, in the comparator 13, a difference in the rate of rise occurs between the first intermediate output voltage po_m and the second intermediate output voltage po_p due to, for example, a variation in parasitic capacitance depending on the layout, or a variation in the production of semiconductor elements. The comparator 13 determines the voltage levels of the first output signal lo_m and the second output signal lo_p, which are held in the latch circuit 41, based on the difference in the rate of rise between the first intermediate output voltage po_m and the second intermediate output voltage po_p. Further, the comparator 13 determines the logic levels of the determination result signals OUT+ and OUT− according to the voltage levels of the determined first output signal lo_m and second output signal lo_p. Furthermore, upon determination of the logic levels of the determination result signals OUT+ and OUT−, the comparator 13 brings the determination end signal END into the high level.

During a comparison operation for generating the AD conversion result signal Dout having a potential difference between the positive-side comparison line SND+ and the negative-side comparison line SND−, a difference in the rate of rise occurs between the first intermediate output voltage po_m and the second intermediate output voltage po_p dominantly due to the input voltage difference. However, in a conversion process for lower bits in which the potential difference between the positive-side comparison line SND+ and the negative-side comparison line SND− decreases, the difference between the offset voltage of the comparator 13 and the input potential difference decreases, and the offset voltage has a large effect on the conversion result.

As shown in FIGS. 8 to 10, in the comparator 13, the difference in the rate of rise between the first intermediate output voltage po_m and the second intermediate output voltage po_p can be reduced by changing the offset control value OC.

For example, when the case where the offset control value is "0" as shown in FIG. 8 is compared with the case where the offset control value is "+1" as shown in FIG. 9, the voltage difference between the first intermediate output voltage po_m and the second intermediate output voltage po_p during the determination of the magnitude relationship between the intermediate output voltages of the latch circuit 41 in the timing diagram shown in FIG. 9 is smaller than that in the timing diagram shown in FIG. 8.

Further, when the case where the offset control value is "+1" as shown in FIG. 9 is compared with the case where the offset control value is "+2" as shown in FIG. 10, in the timing diagram shown in FIG. 10, the magnitude relationship between the first intermediate output voltage po_m and the second intermediate output voltage po_p during the determination of the magnitude relationship of the intermediate output voltages of the latch circuit 41 is reversed and the voltage difference decreases, as compared with the timing diagram shown in FIG. 9. Accordingly, the determination result in the timing diagram shown in FIG. 10 indicates the logic level inverted from the logic level indicated by the determination result in the timing diagrams shown in FIGS. 8 and 9.

As seen from the above description, in the comparator 13, the load capacitance of the lines from which the first intermediate output voltage po_m and the second intermediate output voltage po_p are respectively output is changed by changing the offset control value OC. This enables the comparator 13 to reduce the input offset voltage by changing the offset control value OC. As described above, the operation in which two intermediate output voltages are caused to rise in synchronization with the internal clock signal, such as the determination start signal SRT, and the magnitude relationship of the voltage difference between input signals is determined according to the difference in the rate of rises between the two intermediate output voltages is referred to as a dynamic operation.

Figure 11:
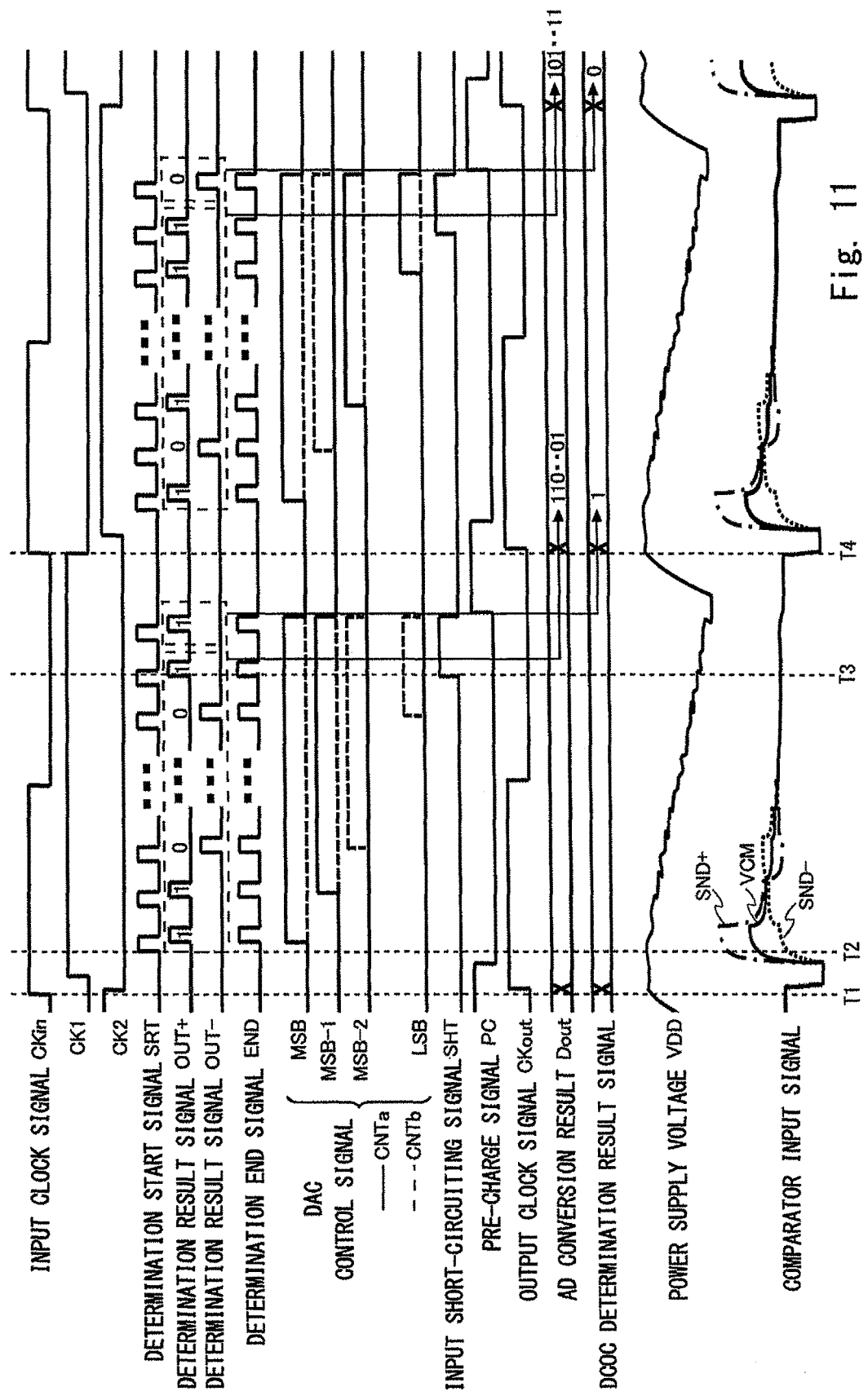
FIG. 11 is a timing diagram for explaining an operation of the AD converter according to the first embodiment.

Next, the operation of the AD converter 1 according to the first embodiment will be described. FIG. 11 shows a timing diagram for explaining the operation of the AD converter 1 according to the first embodiment. As shown in FIG. 11, the AD converter 1 according to the first embodiment completes one conversion cycle during one cycle of the externally-input input clock signal CKin. At this time, the AD converter 1 performs an asynchronous operation. Accordingly, the timing at which the conversion process is completed during one cycle of the input clock signal CKin varies depending on circumstances such as the temperature of the semiconductor device.

Upon starting the conversion cycle, the AD converter 1 changes the logic levels of the non-overlapping clock signals CK1 and CK2, and outputs the values, which are sampled by the sample-and-hold circuit 10 during the previous conversion cycle, to the positive-side comparison line SND+ and the negative-side comparison line SND−. During the period from timing T2 to timing T3, the AD converter 1 performs a conversion process for determining values from the most significant bit to the least significant bit of the AD conversion result signal Dout by a successive approximation process.

In this conversion process, the pulse of the determination start signal SRT is generated at a predetermined cycle, and the comparator 13 outputs the conversion result signal according to the generated pulse. Upon determination of the value of the conversion result signal, the comparator 13 causes the determination end signal END to rise. The asynchronous operation successive approximation logic 14 determines the logic level of the DAC control signal CNT in order from the most significant bit side every time the conversion result is obtained. The asynchronous operation successive approximation logic 14 completes a pre-charge operation for the pre-charge capacitors Cdn to Cd1 by the pre-charge signal PC during the period before the start of the conversion process at timing T2.

At timing T3, the asynchronous operation successive approximation logic 14 brings the input short-circuiting signal SHT into the high level and brings the input short-circuiting switch 12 into the conductive state, after all bit values of the AD conversion result signal Dout are determined. Further, the asynchronous operation successive approximation logic 14 outputs a single pulse of the determination start signal SRT in the state where the positive-side comparison line SND+ and the negative-side comparison line SND− are short-circuited by the input short-circuiting signal SHT, and performs the offset determination process. In the example shown in FIG. 11, a positive determination (for example, "1") is made in the offset determination process after timing T3.

At timing T4, the asynchronous operation successive approximation logic 14 updates the AD conversion result signal Dout and the DCOC comparison determination result signal RSLT, which are obtained in the current conversion cycle, in response to the start of the subsequent conversion cycle. The offset control circuit 15 updates the offset control value OC according to the value of the DCOC comparison determination result signal RSLT obtained during the period from timing T1 to timing T4. Then the AD converter 1 carries out the conversion process in the conversion cycle after timing T4 in the state where the offset voltage of the comparator 13 is adjusted based on the offset control value OC updated at timing T4.

As shown in FIG. 11, in the AD converter 1, a large amount of current is consumed by the DAC 11, the comparator 13, the asynchronous operation successive approximation logic 14, and the like during the conversion process. This causes a phenomenon in which the power supply voltage VDD gradually decreases during the conversion process according to an increase in current consumption. In this case, the offset voltage of the comparator 13 has such a feature that the offset voltage changes depending on a change in the power supply voltage VDD.

Since many of the circuit elements operate during the conversion process in the AD converter 1, the junction temperature of each circuit element becomes higher, as the level of bits to be subjected to the conversion process becomes lower. In this case, the offset voltage of the comparator 13 has such a feature that the offset voltage changes due to the effect of the junction temperature of each circuit element, or the environmental temperature of the semiconductor device (these temperatures are collectively referred to as a substrate temperature).

In the AD converter 1 according to the first embodiment, the power supply voltage VDD and the substrate temperature vary during the conversion process as described above. In such a state, the AD converter 1 determines the offset voltage immediately after the conversion of the least significant bit in which the voltage difference to be input to the comparator 13 is minimized, and then completes the conversion cycle. This allows the AD converter 1 to reduce the offset voltage during the conversion of the least significant bit in which the offset voltage of the comparator 13 has a large effect on the conversion result.

Figure 12:
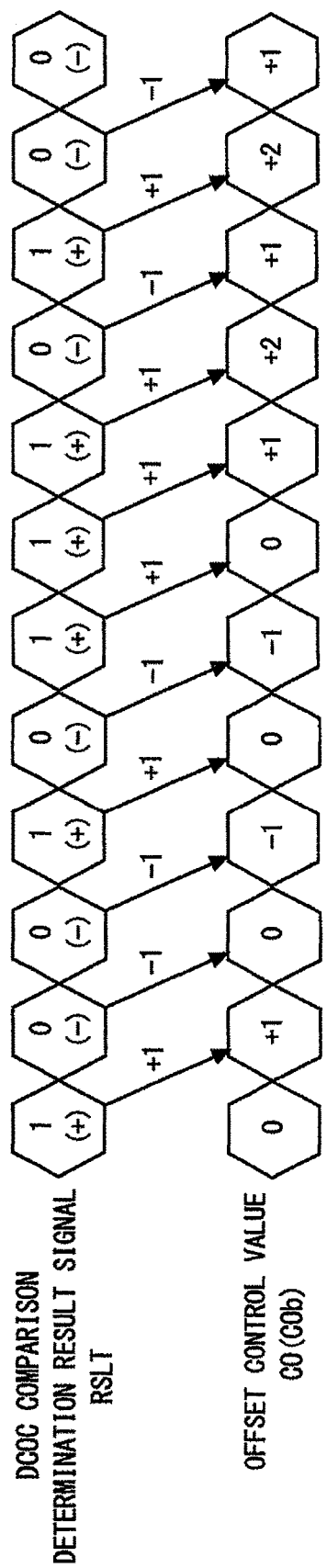
FIG. 12 is a timing diagram for explaining values indicated by a DCOC comparison determination result signal and an offset adjustment amount in the AD converter according to the first embodiment.

The process of updating the offset control value OC in the offset control circuit 15 according to the first embodiment will now be described. FIG. 12 shows a timing diagram for explaining values indicated by the DCOC comparison determination result signal and an offset adjustment amount in the AD converter.

As shown in FIG. 12, when the DCOC comparison determination result signal RSLT obtained in the previous conversion cycle indicates "1" (for example, positive determination), the offset control circuit 15 increases the offset control value OC by 1. On the other hand, when the DCOC comparison determination result signal RSLT obtained in the previous conversion cycle indicates "0" (for example, negative determination), the offset control circuit 15 decreases the offset control value OC by 1. The offset control value OC is represented by integers ranging from negative to positive values.

As seen from the above description, in the AD converter 1 according to the first embodiment, the input short-circuiting switch 12 is provided between two lines that supply input signals to the comparator 13. Further, the input short-circuiting switch 12 is brought into the conductive state during the period immediately after the completion of the conversion of the least significant bit during one conversion cycle, and the offset voltage of the comparator 13 is determined. In the subsequent conversion cycle, the conversion process is carried out by the comparator 13 whose offset voltage has been corrected based on the result of the determination of the offset voltage.

This operation allows the AD converter 1 according to the first embodiment to reduce the offset voltage during the conversion of the least significant bit in which the offset voltage of the comparator 13 has a large effect on the conversion result. Moreover, the reduction in the offset voltage during the conversion of the least significant bit enables the AD converter 1 according to the first embodiment to achieve a high conversion accuracy.

While the comparator 13 that performs the dynamic operation has been described above, the offset correction method can also be applied to a converter that performs a static operation. For example, if input signals are set to the same potential by a switch provided at the input terminal of the converter immediately after the conversion of the least significant bit as described above, the converter that performs the static operation can also obtain a conversion result with high accuracy.

The asynchronous-type AD converter that performs the conversion operation for each bit independently of the cycle of the externally-input input clock signal CKin has been described above. In this asynchronous-type AD converter, as described above, the frequency of the clock signal, which is generated by the asynchronous operation successive approximation logic 14 and indicates the conversion timing for each bit, varies depending on the substrate temperature. This makes it difficult to determine the conversion timing of the least significant bit. However, in the AD converter 1 according to the first embodiment, the asynchronous operation successive approximation logic 14 that controls the conversion timing for each bit outputs the input short-circuiting signal SHT for controlling the switching condition of the input short-circuiting switch 12. Accordingly, even when the conversion timing of the least significant bit is indefinite as in the asynchronous-type AD converter, the offset voltage of the comparator 13 can be determined immediately after the conversion of the least significant bit.

As described above, in the AD converter 1 according to the first embodiment, an extremely small offset voltage that affects the conversion result of the least significant bit is corrected. Accordingly, in order to perform the offset correction process accurately, it is necessary to prevent a variation in the parasitic capacitance or the like, which is parasitic to the comparator 13 and the line through which the input voltage of the comparator 13 is transmitted, from occurring between the positive-side comparison line SND+ and the negative-side comparison line SND−. In this regard, the layout associated with the comparator 13 of the AD converter 1 according to the first embodiment will be described below.

Figure 13:
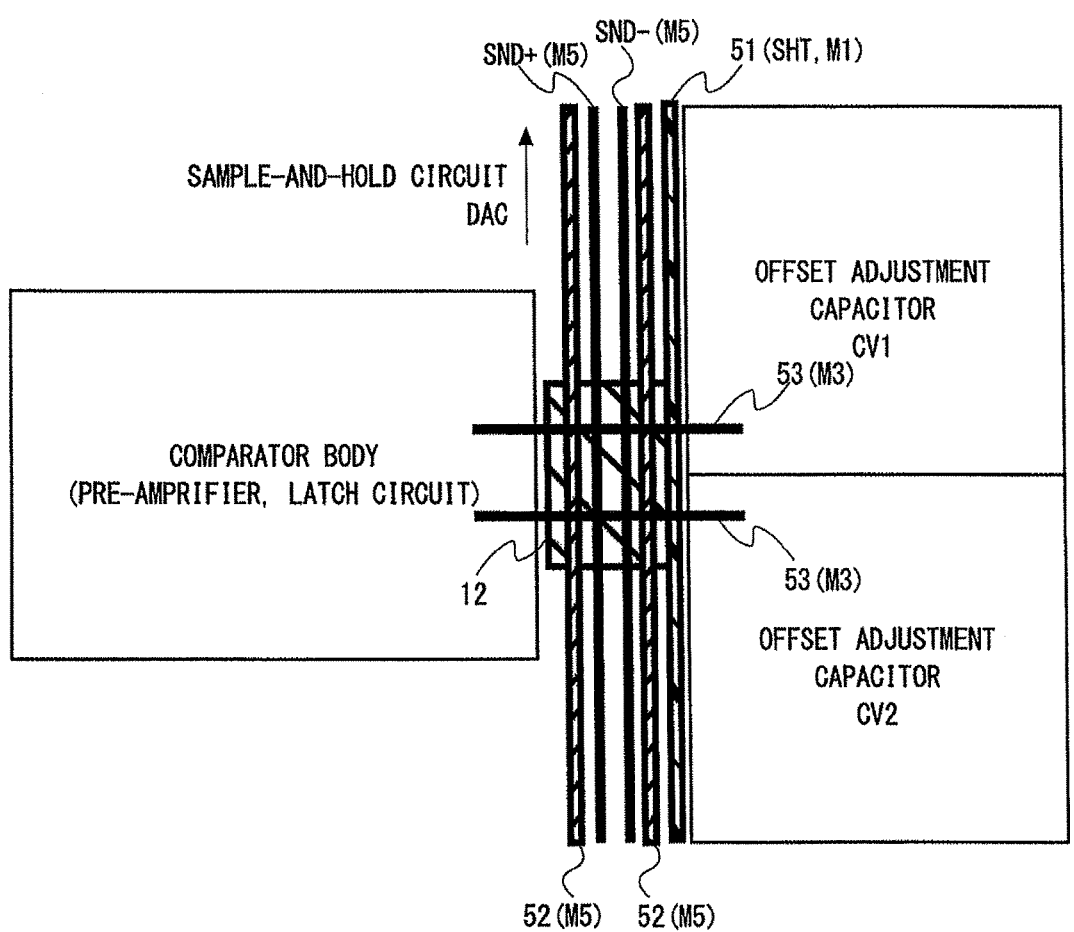
FIG. 13 is a schematic diagram for explaining a layout of the comparator according to the first embodiment.

First, FIG. 13 shows a schematic diagram for explaining the layout of the comparator 13 according to the first embodiment. As shown in FIG. 13, the comparator 13 has a configuration in which a comparator body portion and the offset adjustment capacitors CV1 and CV2 are arranged in a divided manner. The comparator body portion includes the pre-amplifier 40, the latch circuit 41, and the inverter 42 which are shown in FIG. 7. The input short-circuiting switch 12 is formed in a region which is sandwiched between the comparator body portion and the offset adjustment capacitors CV1 and CV2.

As shown in FIG. 13, the positive-side comparison line SND+ and the negative-side comparison line SND− are formed in an upper layer of the input short-circuiting switch 12 and are arranged between the comparator body portion and the offset adjustment capacitors CV1 and CV2. The positive-side comparison line SND+ and the negative-side comparison line SND− are formed in a region extending from one end of the region in which the comparator 13 is formed to the other end thereof. In the example shown in FIG. 13, the length of a side at which the offset adjustment capacitors CV1 and CV2 are parallel to the positive-side comparison line SND+ and the negative-side comparison line SND− is longer than the length of a side at which the comparator body is parallel to the positive-side comparison line SND+ and the negative-side comparison line SND−. Accordingly, in the example shown in FIG. 13, the positive-side comparison line SND+ and the negative-side comparison line SND− are formed so as to have at least the length from one end of the region in which the offset adjustment capacitors CV1 and CV2 are formed to the other end thereof. Note that in FIG. 13, only the main line portions of the positive-side comparison line SND+ and the negative-side comparison line SND− are shown. At one end of each of the positive-side comparison line SND+ and the negative-side comparison line SND−, the sample-and-hold circuit 10 or the DAC 11 is disposed.

The arrangement of the positive-side comparison line SND+ and the negative-side comparison line SND− in such a manner that the lines are not stopped at the node between the input short-circuiting switch 12 and the lines makes it possible to form the two lines with the same length and to reduce the difference in parasitic capacitance between the lines. Further, the comparator body portion and the offset adjustment capacitors CV1 and CV2 are arranged in a divided manner, and the positive-side comparison line SND+, the negative-side comparison line SND−, and the input short-circuiting switch 12 are arranged between the comparator body portion and the offset adjustment capacitors. This arrangement makes it possible to reduce the distance at which the positive-side comparison line SND+ and the negative-side comparison line SND− are parallel to the region in which the circuit elements constituting the comparator 13 are formed, and to reduce the parasitic capacitance.

As shown in FIG. 13, in the comparator 13, shield lines 52 are formed so as to sandwich the positive-side comparison line SND+ and the negative-side comparison line SND−. The arrangement of the shield lines 52 in this manner leads to a reduction in the effect of noise, which is caused due to operations of other circuit elements, on the voltage levels of the positive-side comparison line SND+ and the negative-side comparison line SND−.

As shown in FIG. 13, in the comparator 13, an input short-circuiting switch control line 51 is formed in a region other than the region in which the comparator body portion and the offset adjustment capacitors CV1 and CV2 are formed. In the example shown in FIG. 13, the input short-circuiting switch control line 51 is formed in a region between the comparator body portion and the offset adjustment capacitors CV1 and CV2. Further, the input short-circuiting switch control line 51 is formed so as to have the length from one end of the region in which the comparator 13 is formed to the other end thereof, as with the negative-side comparison line SND− and the positive-side comparison line SND+. This arrangement allows the parasitic capacitance, which is formed due to the input short-circuiting switch control line 51, to be uniformly formed in the offset adjustment capacitor CV1 and the offset adjustment capacitor CV2, and leads to a reduction in the difference between the capacitances of the offset adjustment capacitors CV1 and CV2. Furthermore, this arrangement makes it possible to reduce the effect of the parasitic capacitance of the input short-circuiting switch control line 51 on the circuit elements in the comparator body portion.

The input short-circuiting switch control line 51 is formed in parallel to the negative-side comparison line SND− with the shield line 52 interposed therebetween. This arrangement makes it possible to reduce the parasitic capacitance formed due to the input short-circuiting switch control line 51, and prevents unevenness in the parasitic capacitance.

As shown in FIG. 13, the comparator 13 further includes capacitor connecting lines 53 which are formed so as to connect the comparator body portion and the offset adjustment capacitors with the input short-circuiting switch 12, the positive-side comparison line SND+, the negative-side comparison line SND−, the input short-circuiting switch control line 51, and the shield lines 52 interposed therebetween, and which connect comparator body internal lines, which are formed within the comparator body, and the offset adjustment capacitors to each other. The capacitor connecting lines 53 are arranged so as to be orthogonal to the positive-side comparison line SND+, the negative-side comparison line SND−, the input short-circuiting switch control line 51, and the shield lines 52. This arrangement makes it possible to reduce the parasitic capacitance between the capacitor connecting lines 53 and other lines, such as the positive-side comparison line SND+, and to suppress a variation in the parasitic capacitance between other lines.

As shown in FIG. 13, in the comparator 13, the positive-side comparison line SND+, the negative-side comparison line SND−, and the shield lines 52 are formed in the same wiring layer (for example, a fifth wiring layer M5). Further, in the comparator 13, the positive-side and negative-side comparison lines SND+ and SND− and the input short-circuiting switch control line 51 are formed in different wiring layers which may be formed with at least one wiring layer or no wiring layer interposed therebetween. In the example shown in FIG. 13, the input short-circuiting switch control line 51 is formed in a first wiring layer M1. Furthermore, in the comparator 13, the positive-side and negative-side comparison lines SND+ and SND− and the capacitor connecting lines 53 are formed in different wiring layers which may be formed with at least one wiring layer or no wiring layer interposed therebetween. As for the capacitor connecting lines 53, it is only necessary that at least portions at which the capacitor connecting lines 53 are orthogonal to the positive-side comparison line SND+ and the negative-side comparison line SND− are formed in different wiring layers. In the example shown in FIG. 13, the capacitor connecting lines 53 are formed in a third wiring layer M3. This arrangement makes it possible to further suppress the parasitic capacitance between lines.

Figure 14:
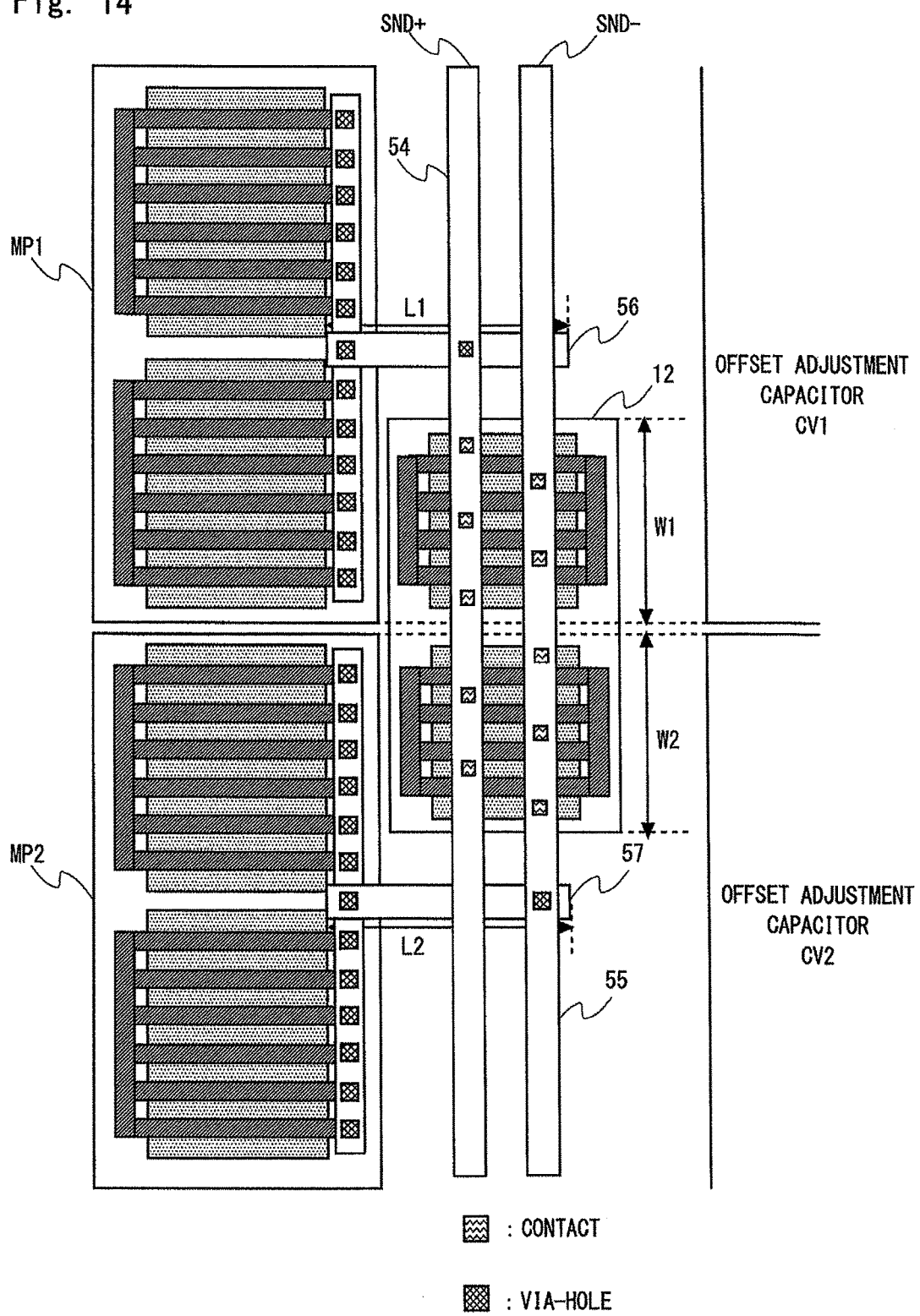
FIG. 14 is a schematic diagram for explaining a layout of the comparator, a switch circuit, and lines according to the first embodiment.

Next, the layout of the input short-circuiting switch 12, the positive-side comparison line SND+, the negative-side comparison line SND−, and the comparator 13 will be described in more detail. FIG. 14 shows a schematic diagram for explaining the layout of the comparator, the switch circuit, and the lines according to the first embodiment. In FIG. 14, only the PMOS transistors MP1 and MP2 which are supplied with input signals in the comparator body portion are illustrated as the comparator body portion.

In the example shown in FIG. 14, the PMOS transistor MP1 corresponds to a first transistor having a gate connected to the first comparison line (for example, the positive-side comparison line SND+), and the PMOS transistor MP2 corresponds to a second transistor having a gate connected to the second comparison line (for example, the negative-side comparison line SND−).

As shown in FIG. 14, the input short-circuiting switch 12 is formed so as to be adjacent to both a first transistor region in which the PMOS transistor MP1 is formed and a second transistor region in which the PMOS transistor MP2 is formed.

In the comparator 13, a distance W1 at which a switch transistor region in which a switch transistor constituting the input short-circuiting switch 12 is formed is parallel to the first transistor region is set to be substantially equal to a distance W2 at which the second transistor region and the switch transistor region are parallel to each other. Further, in the comparator 13, the distance W1 at which the switch transistor region is parallel to a region in which the offset adjustment capacitor CV1 is formed is set to be substantially equal to the distance W2 at which the switch transistor region is parallel to a region in which the offset adjustment capacitor CV2 is formed. This arrangement makes it possible to suppress the effect of the input short-circuiting switch 12 on variations in right and left circuit configurations of the comparator body portion and the offset adjustment capacitors CV1 and CV2.

Furthermore, as shown in FIG. 14, the positive-side comparison line SND+ includes a main line 54 and a branch line 56, and the negative-side comparison line SND− includes a main line 55 and a branch line 56. The main lines 54 and 55 pass through the upper layer of the switch circuit and are formed in a region extending from one end of the region in which the comparator is formed to the other end thereof. The branch line 56 branches from the main line 54 and connects the main line with the gate of the PMOS transistor MP1. The branch line 57 branches from the main line 55 and connects the main line with the gate of the PMOS transistor MP2. Each main line and each branch line are connected via a via-hole. The branch lines 56 and 57 are formed in a wiring layer different from that of the main lines, and are formed with substantially the same length in the direction in which the main lines and the gates of the transistors are respectively connected to each other. In the example shown in FIG. 14, a length L1 of the branch line 56 and a length L2 of the branch line 57 are set to be equal to each other.

If the branch lines are formed simply based on the distance between nodes, a difference in length occurs between the two branch lines. This difference in length causes a variation in the parasitic capacitance. However, as shown in FIG. 14, the lengths of the branch lines are set to be equal to each other, regardless of the distance between nodes, thereby suppressing the effect of the length of each branch line on a variation in the parasitic capacitance.

Figure 15:
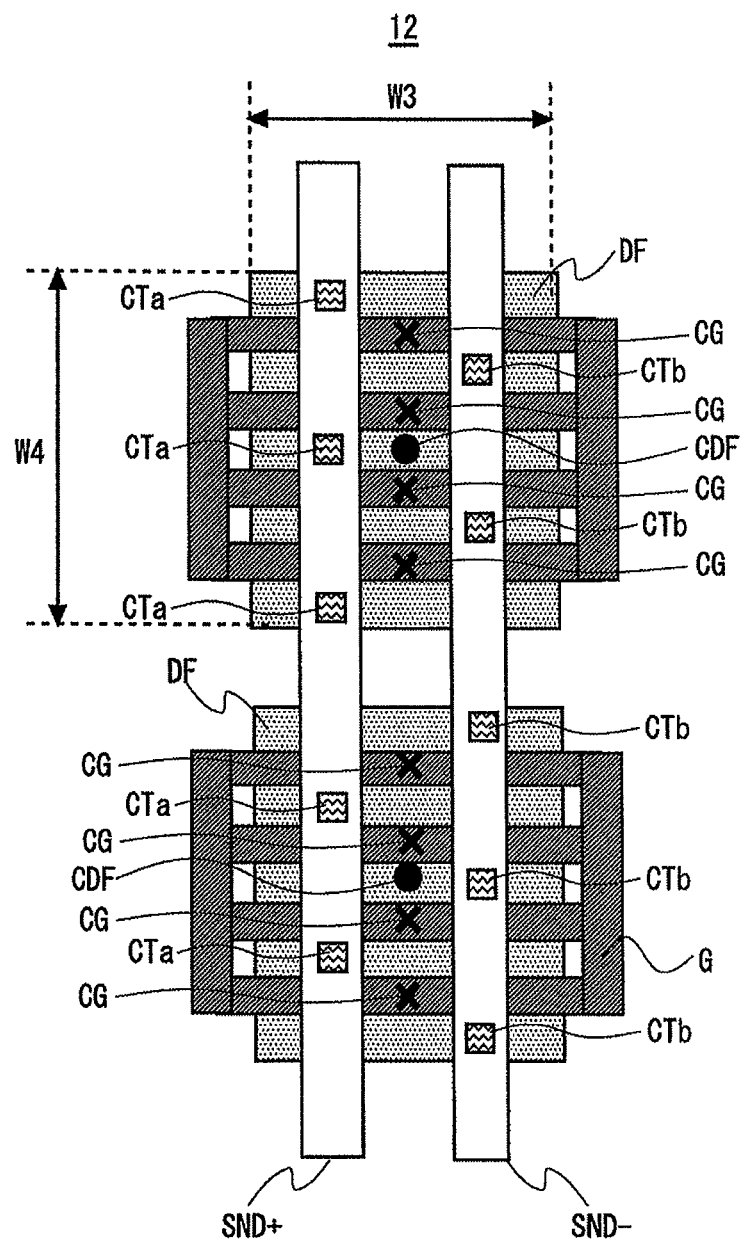
FIG. 15 is a schematic diagram for explaining in detail a layout of the switch circuit and comparison lines according to the first embodiment.

Next, the arrangement relationship the positive-side and negative-side comparison lines SND+ and SND− and the input short-circuiting switch 12 will be described. FIG. 15 shows a schematic diagram for explaining in detail the layout of the switch circuit and the comparison lines according to the first embodiment.

As shown in FIG. 15, in the AD converter 1 according to the first embodiment, the positive-side comparison line SND+ and the negative-side comparison line SND− are arranged so as to sandwich a center point CDF of a diffusion region which serves as the source or drain of the transistor that constitutes the input short-circuiting switch 12. Assuming that the width of the diffusion region is represented by W3 and the length of the diffusion region is represented by W4, for example, the center point CDF can be defined as an intersection of centerlines of the width W3 and the width W4, or as an intersection of diagonal lines of the diffusion region. This arrangement prevents a variation in the parasitic capacitance, which is formed between the input short-circuiting switch 12 and the positive-side and negative-side comparison lines SND+ and SND−, between the two lines.

In another aspect, in the AD converter 1 according to the first embodiment, the positive-side comparison line SND+ and the negative-side comparison line SND− are arranged so as to sandwich a center point CG in the gate width direction of the gate of the transistor constituting the input short-circuiting switch 12. This arrangement prevents a variation in the parasitic capacitance, which is formed between the input short-circuiting switch 12 and the positive-side and negative-side comparison lines SND+ and SND−, between the two lines.

As shown in FIG. 15, in the AD converter 1 according to the first embodiment, contacts CTa that connect the positive-side comparison line SND+ and the transistor of the input short-circuiting switch 12 to each other, and contacts CTb that connect the negative-side comparison line SND− and the transistor of the input short-circuiting switch 12 to each other are provided so as to sandwich the gate of the transistor of the input short-circuiting switch 12. The number of contacts CTa is set to be equal to the number of contacts CTb. In the input short-circuiting switch 12, the number of diffusion regions to which the positive-side comparison line SND+ is connected is set to be equal to the number of diffusion regions to which the negative-side comparison line SND− is connected. This arrangement prevents a variation in the parasitic capacitance, which is formed between the input short-circuiting switch 12 and the positive-side and negative-side comparison lines SND+ and SND−, between the two lines.

As described above, in the AD converter 1 according to the first embodiment, a variation in the parasitic capacitance between two paths for the comparison operation is suppressed by devising the layout of the circuit elements of the comparator 13, the input short-circuiting switch 12, the positive-side comparison line SND+, and the negative-side comparison line SND−. Thus, a variation in the parasitic capacitance between two paths is suppressed, thereby making it possible to determine a small offset voltage without error. In particular, in the AD converter 1 according to the first embodiment, the offset voltage is determined immediately after the comparison operation for the least significant bit is carried out to compare input voltages having an extremely small voltage difference. Therefore, it is extremely important to suppress a variation between paths in this manner so as to suppress an erroneous determination.

Second Embodiment

The first embodiment illustrates an example in which the offset control value OC is updated in each conversion cycle. On the other hand, a second embodiment illustrates an example in which offset determination results (values indicated by the DCOC comparison determination result signal RSLT) in a plurality of conversion cycles are integrated and the offset control value is updated based on a ratio between the number of positive determinations included in the integrated value and the number of negative determinations included in the integrated value.

Figure 16:
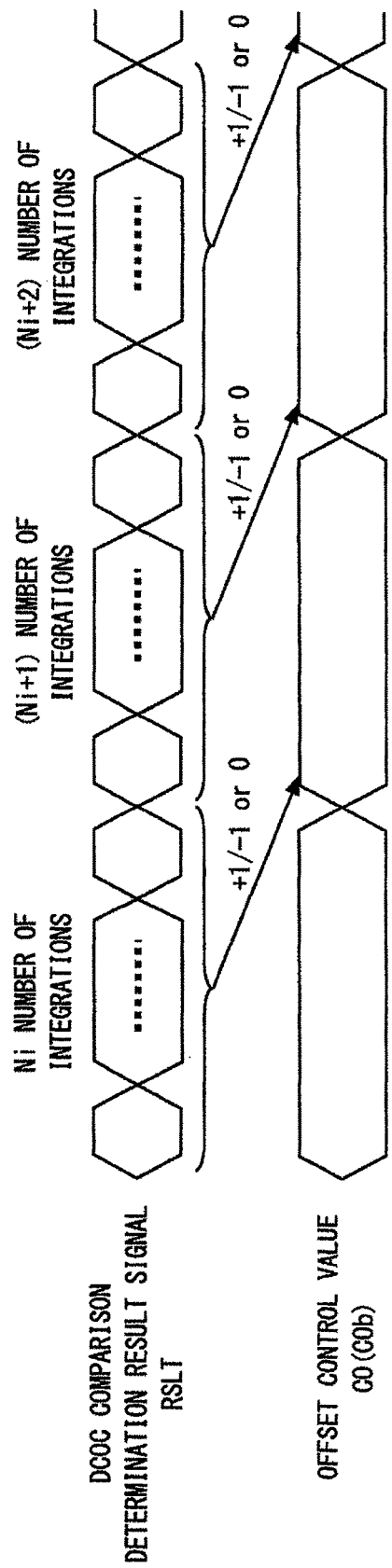
FIG. 16 is a schematic diagram for explaining a positional relationship between the switch circuit and the comparison lines in the layout according to the first embodiment.

FIG. 16 shows a timing diagram for explaining the values indicated by the DCOC comparison determination result signal and the offset adjustment amount in the AD converter 1 according to the second embodiment. As shown in FIG. 16, in the second embodiment, the offset control circuit 15 updates the offset control value when the number of conversion cycles in which the output values of all bits of the conversion result output value (for example, the AD conversion result signal Dout) are generated reaches a preset number of cycles.

Figure 17:
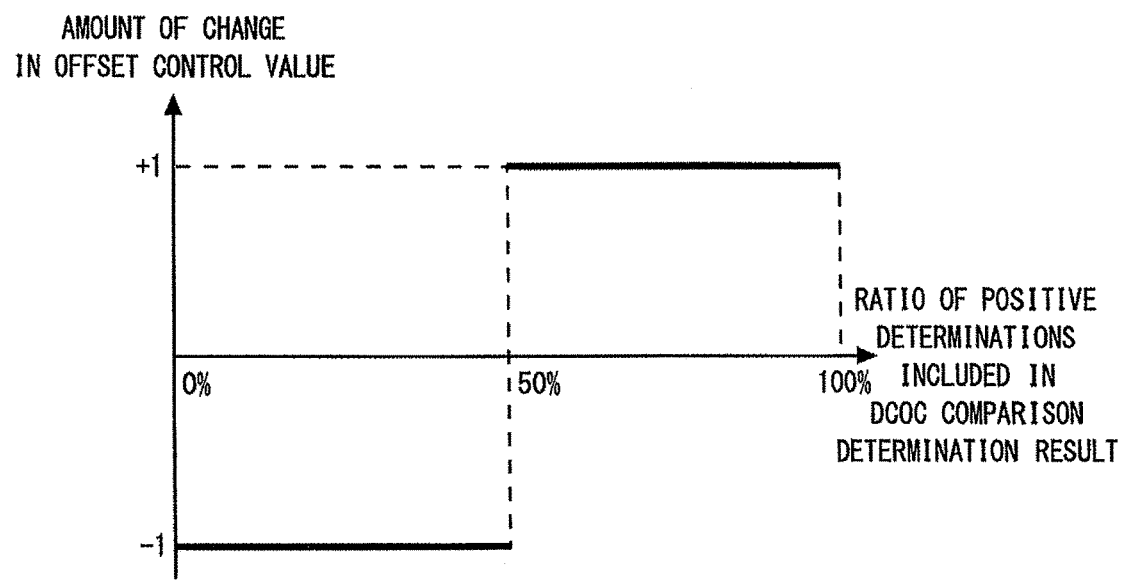
FIG. 17 is a timing diagram for explaining values indicated by a DCOC comparison determination result signal and an offset adjustment amount in an AD converter according to a second embodiment.

FIG. 17 is a graph for explaining the values indicated by the DCOC comparison determination result signal and the offset adjustment amount in the offset control circuit 15 according to the second embodiment. In the example shown in FIG. 17, the offset control value OC is increased when the number of positive determinations is greater than 50% of the ratio between the number of positive determinations and the number of negative determinations included in the integrated value of the DCOC comparison determination result signal RSLT, and the offset control value OC is decreased when the number of negative determinations is greater than 50% of the ratio.

Figure 18:
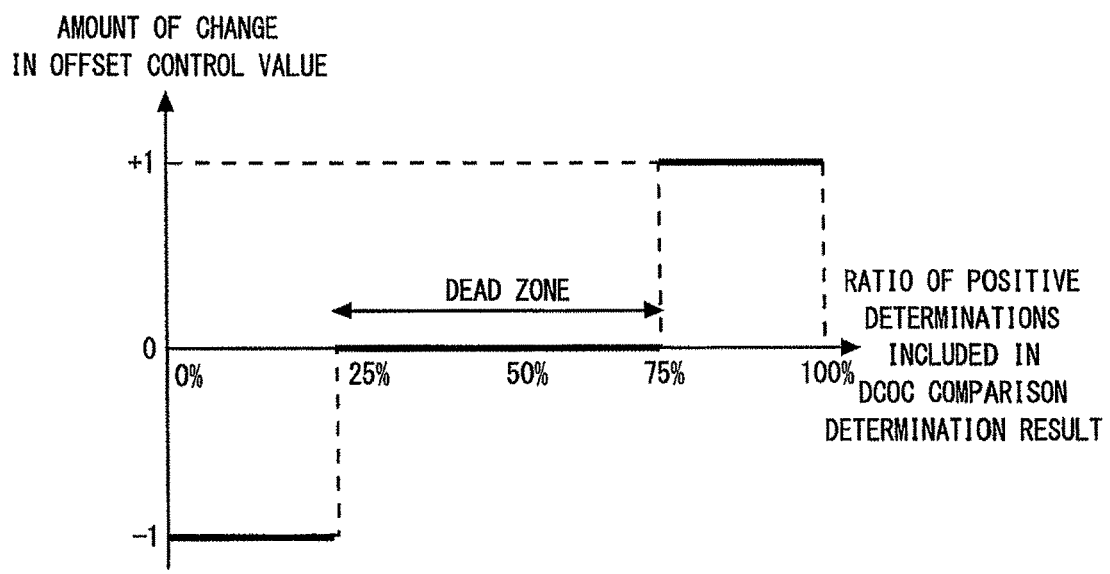
FIG. 18 is a graph for explaining another example of the values indicated by the DCOC comparison determination result signal and the offset adjustment amount in the AD converter according to the second embodiment.

FIG. 18 shows another example showing the criteria for updating the offset control value OC. In the example shown in FIG. 18, the offset control value OC is increased when the ratio of the number of positive determinations included in the integrated value of the DCOC comparison determination result signal RSLT is equal to or greater than 75%; the offset control value OC is decreased when the ratio of the number of positive determinations is equal to or less than 25%; and the offset control value OC is maintained when the ratio between the number of positive determinations and the number of negative determinations is in the range from 25% to 75%.

In this manner, the values indicated by the DCOC comparison determination result signal RSLT obtained in a plurality of conversion cycles are integrated and the offset control value OC is updated based on the ratio between the number of positive determinations and the number of negative determinations included in the integrated value, thereby achieving a more stable operation than when the offset control value OC is updated in each conversion cycle.

Figure 19:
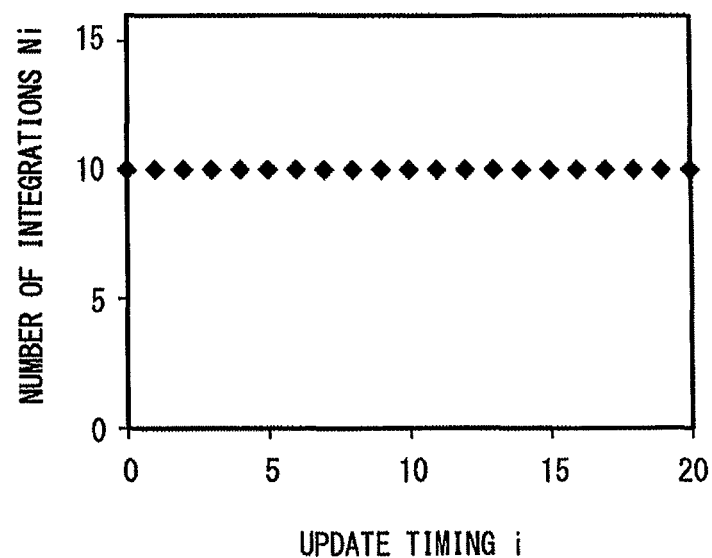
FIG. 19 is a graph for explaining a relationship between an update timing of an offset control value and the number of integrations of the values indicated by the DCOC comparison determination result signal in the AD converter according to the second embodiment.
Figure 20:
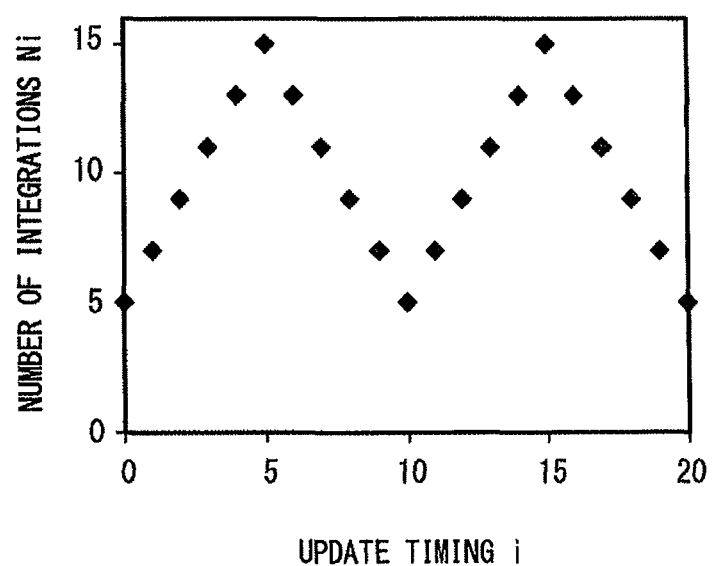
FIG. 20 is a graph for explaining another example of the relationship between the update timing of the offset control value and the number of integrations of the values indicated by the DCOC comparison determination result signal in the AD converter according to the second embodiment.
Figure 21:
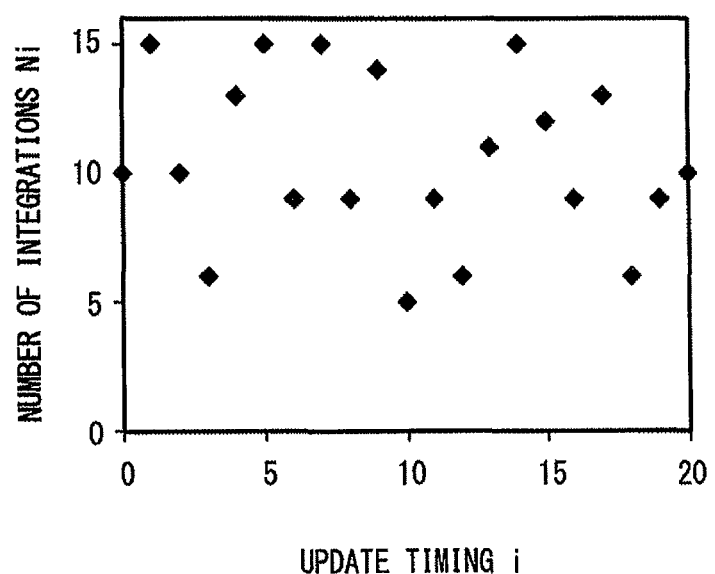
FIG. 21 is a graph for explaining further another example of the relationship between the update timing of the offset control value and the number of integrations of the values indicated by the DCOC comparison determination result signal in the AD converter according to the second embodiment.

In this regard, various forms of the number of conversion cycles to be integrated can be used. FIGS. 19 to 21 are graphs for explaining the relationship between the update timing of the offset control value and the number of integrations of the values indicated by the DCOC comparison determination result signal in the AD converter according to the second embodiment.

In the example shown in FIG. 19, the number of processing cycles of integration is set to be constant, regardless of an update timing "i" of the offset control value OC. In the example shown in FIG. 20, the number of integrations is changed according to the update timing "i" of the offset control value OC. In the example shown in FIG. 20, the number of integrations is increased or decreased in a constant cycle and within a constant range. In the example shown in FIG. 21, the number of integrations is randomly changed for each update timing "i" of the offset control value OC. In the case of randomly changing the number of integrations, a pseudorandom generator that generates random numbers by using a middle-square method, a linear congruential method, a linear feedback shift register, or the like can be used.

In this manner, when the number of conversion cycles to be integrated is set to be constant as shown in FIG. 19, noise (for example, spurious tones) depending on the update cycle may be generated. However, as shown in FIGS. 20 and 21, for example, when the number of conversion cycles to be integrated is changed, a fluctuation occurs in the integrated value, which makes it possible to suppress spurious tones.

The invention made by the present inventor has been described in detail above with reference to embodiments. However, the present invention is not limited to the embodiments described above, and can be modified in various manners without departing from the scope of the invention. Further, the scope of the claims is not limited by the embodiments described above. Furthermore, it is noted that, Applicant's intent is to encompass equivalents of all claim elements, even if amended later during prosecution.

For example, in the semiconductor device according to the embodiments described above, the conductivity type (p-type or n-type) of the semiconductor substrate, semiconductor layer, diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The first and second embodiments can be combined as desirable by one of ordinary skill in the art.

What is claimed is:

1. A semiconductor device comprising:
    a sample-and-hold circuit that samples an input signal, outputs differential voltages to a first comparison line and to a second comparison line;
    a comparator that outputs an output value according to a voltage difference between the first comparison line and the second comparison line;
    a digital-to-analog conversion circuit that changes the differential voltages of the first comparison line and the second comparison line according to the output value;
    a successive approximation control circuit that controls the sample-and-hold circuit, the comparator, and the digital-to-analog conversion circuit according to a preset successive approximation sequence, and outputs a plurality of output bits as a conversion result of the input voltage; and
    a switch circuit that is provided between the first comparison line and the second comparison line, and that is switched by the successive approximation control circuit,
    wherein, when the conversion result is acquired, the successive approximation control circuit switches the switch circuit into a conductive state, and outputs control signal to adjust an input offset voltage of the comparator according to the output bits while the switch circuit is in the conductive state, and
    wherein the comparator changes the input offset voltage according to the control signal.

2. The semiconductor device according to claim 1, further comprising:
    an offset control circuit that receives the control signal from the successive approximation control circuit and outputs an offset control value to the comparator to change the input offset voltage,
    wherein the comparator includes:
        a pre-amplifier that amplifies the voltage difference between the first comparison line and the second comparison line, and outputs a first intermediate output voltage and a second intermediate output voltage,
        a latch circuit that determines a logic level of the output value according to the first intermediate output voltage and the second intermediate output voltage,
        a first offset adjustment capacitor connected to a first intermediate voltage line through which the first intermediate output voltage is transmitted from the pre-amplifier to the latch circuit, and
        a second offset adjustment capacitor connected to a second intermediate voltage line through which the second intermediate output voltage is transmitted from the pre-amplifier to the latch circuit,
    wherein a capacitance ratio between the first offset adjustment capacitor and the second offset adjustment capacitor changes according to the offset control value.

3. The semiconductor device according to claim 2, wherein the control signal controls the input offset voltage of the comparator to increase or decrease.

4. The semiconductor device according to claim 2, wherein the offset control circuit updates the offset control value after the output bits are generated.

5. The semiconductor device according to claim 2, wherein the offset control circuit updates the offset control value after a preset number of cycles of generating the output bits.

6. The semiconductor device according to claim 5, wherein the offset control circuit changes the number of cycles after the offset control value is updated.

7. The semiconductor device according to claim 5, wherein the offset control circuit determines the control value according to a ratio between a number of positive determinations and a number of negative determinations of the preset number of cycles.

* * * * *